(12) United States Patent
Takeuchi

(10) Patent No.: US 8,803,632 B2
(45) Date of Patent: Aug. 12, 2014

(54) HIGH-FREQUENCY CIRCUIT, HIGH-FREQUENCY DEVICE, AND MULTIBAND COMMUNICATIONS APPARATUS

(75) Inventor: Shinichirou Takeuchi, Tottori (JP)

(73) Assignee: Hitachi Metals, Ltd., Tokyo (JP)

( * ) Notice: Subject to any disclaimer, the term of this patent is extended or adjusted under 35 U.S.C. 154(b) by 506 days.

(21) Appl. No.: 13/127,890

(22) PCT Filed: Nov. 5, 2009

(86) PCT No.: PCT/JP2009/068918
§ 371 (c)(1),
(2), (4) Date: Jul. 12, 2011

(87) PCT Pub. No.: WO2010/053131
PCT Pub. Date: May 14, 2010

(65) Prior Publication Data
US 2011/0260806 A1    Oct. 27, 2011

(30) Foreign Application Priority Data

Nov. 5, 2008 (JP) ................................. 2008-284283
Nov. 28, 2008 (JP) ................................. 2008-304034

(51) Int. Cl.
*H01P 1/10* (2006.01)
*H04B 1/48* (2006.01)
(52) U.S. Cl.
USPC .............................. 333/101; 333/103; 455/78
(58) Field of Classification Search
USPC ......... 333/101, 103, 126, 129; 455/73, 78, 83
See application file for complete search history.

(56) References Cited

U.S. PATENT DOCUMENTS

| | | | |
|---|---|---|---|
| 6,995,630 B2 * | 2/2006 | Satoh et al. | 333/133 |
| 7,328,041 B2 * | 2/2008 | Tasaka | 455/552.1 |
| 2005/0079828 A1 | 4/2005 | Tasaka | |

FOREIGN PATENT DOCUMENTS

| | | |
|---|---|---|
| JP | 08-223021 A | 8/1996 |
| JP | 10-093471 A | 4/1998 |
| JP | 2005-020140 | 1/2005 |
| JP | 2005-123740 A | 5/2005 |
| JP | 2008-124556 A | 5/2008 |

* cited by examiner

*Primary Examiner* — Dean O Takaoka
(74) *Attorney, Agent, or Firm* — Sughrue Mion, PLLC

(57) ABSTRACT

A high-frequency circuit for use in a multiband wireless apparatus for switching the connection between an antenna and transmission/reception circuits depending on signals for pluralities of communications systems, comprising a single-pole, multi-throw switch circuit comprising FET switch circuits between a common port connected to an antenna-side circuit and pluralities of single ports connected to the transmission/reception circuits, and a first matching circuit connected to the common port; the first matching circuit comprising a first inductance element connected in series to a signal path between the antenna and the common port, and a first capacitance element connected to the first inductance element on the antenna side and grounded; the first inductance element making the impedance of the single-pole, multi-throw switch circuit inductive when the single port is viewed from the antenna side; and the first capacitance element adjusting impedance matching between the antenna-side circuit and the transmission/reception circuits.

29 Claims, 24 Drawing Sheets

▲ : 824 MHz
△ : 2170 MHz

Common Port *a* Side

▲ : 824 MHz
△ : 2170 MHz

Single Port *b* Side

▲: 824 MHz
△: 2170 MHz

Common Port *a* Side

▲: 824 MHz
△: 2170 MHz

Single Port *d* Side

Common Port *a* Side

▲: 824 MHz
△: 2170 MHz

Single Port *f* Side

▲: 824 MHz
△: 2170 MHz

Common Port *a'* Side

▲: 824 MHz
△: 2170 MHz

Single Port *b* Side

▲: 824 MHz
△: 2170 MHz

Common Port a' Side

Single Port d Side

▲ : 824 MHz
△ : 2170 MHz

Common Port *a'* Side

▲ : 824 MHz
△ : 2170 MHz

Single Port *f* Side

Common Port *a'* Side

▲: 824 MHz
△: 2170 MHz

Single Port *b* Side

▲: 824 MHz
△: 2170 MHz

▲ : 824 MHz
△ : 2170 MHz

Common Port *a'* Side

▲ : 824 MHz
△ : 2170 MHz

Single Port *d* Side

▲: 824 MHz
△: 2170 MHz

Common Port *a'* Side

▲: 824 MHz
△: 2170 MHz

Single Port *f* Side

▲: 824 MHz
△: 2170 MHz

Common Port *a'* Side

▲: 824 MHz
△: 2170 MHz

Single Port *f'* Side

Common Port Side

Single Port Side

Common Port Side

Single Port Side (When Connected)

(When Disconnected)

HIGH-FREQUENCY CIRCUIT, HIGH-FREQUENCY DEVICE, AND MULTIBAND COMMUNICATIONS APPARATUS

CROSS REFERENCE TO RELATED APPLICATIONS

This application is a National Stage of International Application No. PCT/JP2009/068918 filed Nov. 5, 2009, claiming priority based on Japanese Patent Application No. 2008-284283 filed Nov. 5, 2008 and 2008-304034 filed Nov. 28, 2008, the contents of all of which are incorporated herein by reference in their entirety.

FIELD OF THE INVENTION

The present invention relates to a high-frequency circuit for switching input/output signals in a multiband wireless apparatus, particularly to a high-frequency circuit comprising a single-pole, multi-throw switch circuit comprising pluralities of parallel-connected field effect transistors FETs, a high-frequency device having such a high-frequency circuit, and a multiband communications apparatus comprising such a high-frequency device.

BACKGROUND OF THE INVENTION

With wide varieties of bands used recently in wireless communications with cell phones, etc., cell phones capable of handling pluralities of transmission/reception bands for a dual band system, a triple band system, a quadband system, etc. are widely used. For example, the frequency bands for communications systems used in quadband cell phones include GSM850/900 (824-960 MHz), DCS (1710-1850 MHz), PCS (1850-1990 MHz), UMTS (Band1: 1920-2170 MHz, Band2: 1850-1990 MHz, Band3: 1710-1880 MHz, Band4: 1710-2155 MHz, Band5: 824-894 MHz, Band6: 830-885 MHz, Band1: 2500-2690 MHz, Band8: 880-960 MHz, Band9: 1749.9-1879.9 MHz, Band10: 1710-2170 MHz), etc. For example, the frequencies of DCS (digital cellular system), PCS (personal communication services) and UMTS Band1 (universal mobile telecommunications system) are substantially 2-2.5 times the frequency of GSM (global system for mobile communications). In the following explanation, GSM is used in a basic frequency band, and frequency bands higher than it are called higher frequency bands.

As communications apparatuses such as multiband cell phones, etc. have become smaller and lighter with higher performance, switch circuits constituting high-frequency circuits contained therein have had a larger number of ports, resulting in many switch circuits with 4 or more ports. JP 2005-123740 A discloses a high-frequency switch module shown in FIG. 26, which comprises a single-pole, five-throw switch circuit having FET switch circuits. This high-frequency switch module 20 for use in triple band cell phones comprises a switch device 10 comprising a single-pole, five-throw switch circuit 10a and a decoder 10b, lowpass filter circuits 15a, 15b, bandpass filter circuits 15c, 15d, 15e, and an ESD protection circuit 18. FIG. 27 shows the structure of the single-pole, five-throw switch circuit 10a. The single-pole, five-throw switch circuit 10a, which is obtained by parallel-connecting single-pole, single-throw FET switch circuits having the same circuit structure, comprises a common terminal a to be connected to an antenna ANT, and transmission terminals b, c and receiving terminals d, e, f to be connected to transmission/reception circuits, etc.

FIG. 28 shows the structure of an FET switch circuit Q1 as an example of FET switch circuits. The FET switch circuit Q1 comprises a terminal 250a for inputting signals, a terminal 250b for outputting signals, and a control terminal Vc1 to which voltage for ON/OFF control is applied. A resistor R is connected to block current leakage. This example comprises one FET, but two or more FETs may be connected in series to reduce equivalent capacitance at OFF, thereby preventing harmonic distortion.

To improve isolation characteristics between the ports, the FET switch circuit may comprise FET Q1-1 connected to the input terminal 250a and the output terminal 250b, and shunt-connected FET Q1-2 (FIG. 31). Connected to the gates of FETs Q1-1 and Q1-2 each via a resistor R for blocking current leakage are control terminals Vc1, Vc2 applying voltage for controlling the ON/OFF state. When the input terminal 250a and the output terminal 250b are connected, Q1-1 is in an ON state, while Q1-2 is in an OFF state (FIG. 32). On the other hand, when the input terminal 250a and the output terminal 250b are in a disconnected state, Q1-1 is in an OFF state, while Q1-2 is in an ON state (FIG. 33). In any state, the equivalent capacitance of Q1-1 or Q1-2 is connected to the input terminal 250a, resulting in more equivalent capacitance added than the FET switch circuit shown in FIG. 28.

The single-pole, multi-throw switch circuit 10a may be constituted by combining different FET switch circuits. In that case, for example, the FET switch circuit shown in FIG. 28 may be used in some signal paths, and the FET switch circuit shown in FIG. 31 may be used in the other signal paths.

FIG. 29 shows the equivalent circuit of the single-pole, five-throw switch circuit 10a, in which the common terminal a and the transmission terminal b are in a connected state, and FIG. 30 shows the equivalent circuit when the equivalent capacitance in an OFF state is synthesized. The FET switch is equivalent to the resistor R when it is in an ON state, and equivalent to capacitance Coff when it is in an OFF state. In the single-pole, multi-throw switch circuit, an FET switch in one of the signal paths is controlled to an ON state, so that the common terminal a is connected to one of the transmission terminals b, c and receiving terminals d e, f. The transmission terminals b, c and receiving terminals d, e, f are connected to load impedances Zlb-Zlf.

More parallel-connected FET switch circuits provide more capacitance Coff added between the single-pole, multi-throw switch circuit and the ground, so that the impedance of the single-pole, multi-throw switch circuit is capacitive when viewing the transmission terminal b from the common terminal a. With the increased capacitance Coff, impedance changes lower along an equal conductance line in a Smith chart, resulting in lower return loss and increased insertion loss. This is a problem to be overcome for single-pole, multi-throw switch circuits with an increasingly larger number of ports (JP 8-223021 A).

To solve this problem, JP 2008-124556 A proposes the series connection of inductors to ports at a common terminal and other terminals for impedance matching. However, JP 2008-124556 A does not investigate at all a case where different equivalent capacitances are provided to signal paths by FET switch circuits.

Wireless communications apparatuses such as cell phones, etc. are operated not only in different frequency bands but also with different powers depending on the communications systems. For example, the maximum transmission power of GSM850/900 is larger than those of the other communications systems, and DCS, PCS and UMTS conduct transmission and reception with different powers. Correspondingly, FET switches have different structures, such as gate width adjusted for every signal path, the parallel connection of capacitance between the gate and the source or drain, etc. Accordingly, the equivalent capacitance of the FET switch circuit also differs for every signal path, resulting in impedance variation (deviation) due to the equivalent capacitance, which also differs for every signal path. Its influence is larger in higher frequency bands such as PCS and UMTS than the basic frequency band such as GSM, etc.

JP 2008-124556 A describes that when the standard of return loss differing for every signal path is required, the return loss can be finely adjusted by the position of the inductor. However, when the inductor is constituted by a bonding wire, pluralities of bonding wires are crossing and nearing, generating interference between signal paths, resulting in the deterioration of isolation characteristics and impedance difference due to the parasitic reactance. Transistors and inductors can be integrated on a silicon substrate to provide IPDs (integrated passive devices), but it makes the single-pole, multi-throw switch circuit larger, and provides such problems as the deterioration of isolation characteristics and impedance difference due to the parasitic reactance.

OBJECTS OF THE INVENTION

Accordingly, an object of the present invention is to provide a high-frequency circuit comprising a single-pole, multi-throw switch circuit for switching the connection between an antenna and transmission/reception circuits depending on signals for pluralities of communications systems, thereby easily suppressing impedance difference between the signal paths even when FET switches provide different equivalent capacitances to signal paths, making it unlikely to cause the deterioration of isolation characteristics and signal loss characteristics, and thus having improved VSWR (voltage standing wave ratio) characteristics particularly in higher frequency bands in each signal path.

Another object of the present invention is to provide a high-frequency circuit having the above features, with a fewer number of signal paths relative to the number of communications systems handled by the single-pole, multi-throw switch circuit.

A further object of the present invention is to provide a high-frequency device having such a high-frequency circuit.

A still further object of the present invention is to provide a multiband communications apparatus comprising such a high-frequency device.

DISCLOSURE OF THE INVENTION

The high-frequency circuit of the present invention for use in a multiband wireless apparatus for switching the connection between an antenna and transmission/reception circuits depending on signals for pluralities of communications systems comprises a single-pole, multi-throw switch circuit comprising FET switch circuits between a common port connected to an antenna-side circuit and pluralities of single ports connected to the transmission/reception circuits, and a first matching circuit connected to the common port;

the first matching circuit comprising a first inductance element connected in series to a signal path between the antenna and the common port, and a first capacitance element connected to the first inductance element on the antenna side and grounded, the first inductance element making the impedance of the single-pole, multi-throw switch circuit inductive when the single port is viewed from the antenna side, and the first capacitance element adjusting impedance matching between the antenna-side circuit and the transmission/reception circuits.

The single-pole, multi-throw switch circuit is preferably in the form of one package comprising pluralities of FET switch circuits and a decoder for decoding signals for switching the ON/OFF of the FETs to control voltage. The single-pole, multi-throw switch circuit is preferably constituted by a bare-chip or sealed semiconductor.

With the first inductance element connected in series to the common port of the single-pole, multi-throw switch circuit, at least the impedance of a signal path of the single-pole, multi-throw switch circuit, through which a higher frequency band passes, is inductive when viewed from the antenna side. The impedance of the single-pole, multi-throw switch circuit is more preferably inductive in a basic frequency band, too.

With the first inductance element grounded on the antenna side via the first capacitance element, impedance in frequency bands of high-frequency signals can be concentrated to standardized impedance (for example, 50Ω) in accordance with the antenna-side circuit and the transmission/reception circuits. The capacitance of the first capacitance element is set, taking into consideration the synthesized equivalent capacitance of the FET switches at OFF, which corresponds to the grounded capacitance of the single-pole, multi-throw switch circuit. The capacitance of the first capacitance element is set preferably in a mode of connecting signal paths of communications systems in higher frequency bands, in which the capacitance element has large influence, more preferably in a mode of connecting a signal path of a communications system in the highest frequency. When the synthesized equivalent capacitance of the FET switches at OFF largely differs depending on the signal path, the capacitance of the first capacitance element is set preferably to the signal path having the largest synthesized capacitance among those of communications systems in higher frequency bands.

The high-frequency circuit of the present invention preferably comprises a filter circuit disposed in a path between at least one of the single ports and each corresponding transmission/reception circuit, and a second matching circuit connected to a signal path between the single port and the filter circuit; at least one of the filter circuits being a bandpass filter; and the second matching circuit comprising a second inductance element connected in series to the signal path or between the signal path and the ground.

To suppressing the loss of signals passing through a signal path (insertion loss), the second inductance element is preferably connected between the signal path and the ground.

The bandpass filter used for the filter circuit is preferably a SAW (surface acoustic wave) filter, a BAW (bulk acoustic wave) filter, or a BPAW (buried propagating layer acoustic wave) filter. The BAW filter includes a FBAR (film bulk acoustic resonator) type and a SMR (solid mounted resonator) type. The SAW filter and the BAW filter may be used as one package with the low-noise amplifier.

The high-frequency circuit of the present invention preferably comprises an LC filter circuit disposed between at least one of the single ports and each corresponding transmission/ reception circuit, the LC filter circuit comprising a third inductance element and a second capacitance element. The LC filter circuit comprising the third inductance element and the second capacitance element mostly functions as a lowpass filter, a bandpass filter or a notch filter for removing harmonics from signals. In the case of the lowpass filter, the LC filter circuit also functions as a circuit for matching the single-pole, multi-throw switch circuit and the transmission circuit.

The multi-connection systems in pluralities of communications systems include a TDMA (time division multiple access) system and a CDMA (code division multiple access) system.

The high-frequency circuit according to a preferred embodiment of the present invention comprises a filter circuit (bandpass filter) connected between a first single port and a first reception circuit for the first communications system of a TDMA system; an LC filter circuit connected between a second single port and a first transmission circuit for the first and second communications systems of the TDMA system; a filter circuit (first duplexer) connected between a third single port and a second reception circuit for the second communications system of the TDMA system and the first communications system of the CDMA system, and a second transmission circuit for the first communications system of the CDMA system; and a filter circuit (second duplexer) connected between a fourth single port and a third reception circuit for the second communications system of the CDMA system, and a third transmission circuit for the second communications system of the CDMA system; the second matching circuit being connected to at least one path between the first single port of the single-pole, multi-throw switch circuit and the bandpass filter, between the third single port and the first duplexer, and between the fourth single port and the second duplexer.

Each of the first and second duplexers for separating transmitting signals and received signals in a communications system using a CDMA system as a multi-connection system is preferably obtained by connecting bandpass filters having different passbands in parallel. As the first and second duplexers, a SAW filter and/or a BAW filter are preferably connected in parallel to form one package.

Separating transmitting signals of a communications system using a CDMA system, received signals of a communications system using a CDMA system, and received signals of a communications system using a TDMA system with a duplexer, a path between the antenna and the reception circuit of the communications system of a TDMA system can be omitted, and a single-pole, four-throw switch can be used as the single-pole, multi-throw switch circuit. The number of FET switches in the single-pole, multi-throw switch circuit can be reduced, resulting in decreased equivalent capacitance, and thus reduced impedance difference (deviation) among the signal paths.

A third matching circuit comprising a fourth inductance element may be connected between the first duplexer and the second transmission circuit.

In another preferred embodiment of the present invention, the received signals of a communications system using a TDMA system pass through the bandpass filter (excluding the duplexer), the transmitting signals of a communications system using a TDMA system pass through the LC filter circuit, and the transmission signals and received signals of a communications system using a CDMA system pass through the single port to which the bandpass filter and the LC filter are not connected, or the single port to which the duplexer is connected.

In a further preferred embodiment of the present invention, the switch device, the filter elements and the reactance elements are mounted on the insulating substrate (a resin substrate such as a glass-reinforced epoxy substrate or a ceramic substrate). For miniaturization, the reactance elements (coils and capacitors) constituting the matching circuits and the LC filter circuits are formed by electrode patterns in the laminate, and the filter elements and the switch device are mounted on the laminate.

To prevent interference between circuit elements in the laminate, it is preferable that via-holes for connecting electrode patterns formed on different layers in the laminate and ground electrodes are disposed between the circuit patterns, and that electrode patterns for coils do not overlap electrode patterns for different circuit elements in a lamination direction. It is also preferable that semiconductor devices constituting amplifiers, etc. for the transmission/reception circuits are mounted on the laminate, and that the matching circuits are contained in the laminate.

The first high-frequency device of the present invention having in and on an insulating substrate a high-frequency circuit for use in a multiband wireless apparatus for switching the connection between an antenna and transmission/reception circuits depending on signals for pluralities of communications systems, comprises a single-pole, multi-throw switch circuit having FET switch circuits between a common port connected to the antenna and pluralities of single ports connected to the transmission/reception circuits, a first matching circuit connected to the common port, and filter circuits disposed in paths between the single ports and the transmission/reception circuits, at least one of the filter circuits being a bandpass filter;

the first matching circuit comprising a first inductance element connected in series to a signal path between the antenna and the common port of the single-pole, multi-throw switch circuit, and a first capacitance element connected to the first inductance element on the antenna side and grounded;

pluralities of filter terminals connected to the filter circuits being aligned on a first side of a bottom surface of a switch device having the single-pole, multi-throw switch circuit;

filter elements constituting the filter circuits being mounted on an upper surface of the insulating substrate adjacently to the first side of the switch device; and the switch device and the filter elements being connected via connecting lines formed in the insulating substrate.

With the filter elements disposed adjacently to the switch device, parasitic reactance by the connecting lines is suppressed, making it easy for the first matching circuit to suppress impedance difference between the signal paths.

It is preferable that the switch device comprises an antenna terminal on a second side adjacent to the first side, that the first inductance element of the first matching circuit is mounted on the laminate substrate at a position adjacent to the second side of the switch device, and that the switch device and the first inductance element are connected via connecting lines formed in the insulating substrate.

The first inductance element connected in series to the signal path is preferably a high-Q chip inductor. With the first inductance element disposed on the insulating substrate in a region different from those of the filter elements, their connecting lines are not close to each other, thereby suppressing the deterioration of isolation characteristics and signal loss characteristics. With the filter elements close to the switch device disposed on one side of the switch device, and the inductance elements mounted in a vacant region beside the filter element, the mounting region of the insulating substrate can be used efficiently, miniaturizing the high-frequency device.

The second high-frequency device of the present invention having in and on an insulating substrate a high-frequency circuit for use in a multiband wireless apparatus for switching the connection between an antenna and transmission/reception circuits depending on signals for pluralities of communications systems, comprises a single-pole, multi-throw switch circuit having FET switch circuits between a common port connected to the antenna and pluralities of single ports connected to the transmission/reception circuits, a first matching circuit connected to the common port, and filter circuits disposed between the single ports and the transmission/reception circuits, at least one of the filter circuits being a bandpass filter;

the first matching circuit comprising a first inductance element connected in series to a signal path between the antenna and the common port, and a first capacitance element connected to the first inductance element on the antenna side and grounded;

pluralities of filter terminals connected to the filter circuits being aligned on a bottom surface of a switch device having the single-pole, multi-throw switch circuit, and an antenna terminal connected to the antenna being formed on the bottom surface;

the switch device, filter elements constituting the filter circuits and the first inductance element constituting the first matching circuit being adjacently mounted on an upper surface of the insulating substrate; and the switch device and the filter elements, and the switch device and the first inductance element being respectively connected via connecting lines formed in the insulating substrate such that they do not overlap each other in a lamination direction.

The third high-frequency device of the present invention having in and on an insulating substrate a high-frequency circuit for use in a multiband wireless apparatus for switching the connection between an antenna and transmission/reception circuits depending on signals for pluralities of communications systems, comprises a single-pole, multi-throw switch circuit having FET switch circuits between a common port connected to the antenna and pluralities of single ports connected to the transmission/reception circuits, a first matching circuit connected to the common port, and filter circuits disposed between the single ports and the transmission/reception circuits, at least one of the filter circuits being a bandpass filter;

the first matching circuit comprising a first inductance element connected in series to a signal path between the antenna and the common port of the single-pole, multi-throw switch circuit, and a first capacitance element connected to the first inductance element on the antenna side and grounded;

pluralities of filter terminals connected to the filter circuits being aligned on a bottom surface of a switch device having the single-pole, multi-throw switch circuit, and an antenna terminal connected to the antenna being formed on the bottom surface;

the switch device, filter elements constituting the filter circuits and the first inductance element constituting the first matching circuit being adjacently mounted on an upper surface of the insulating substrate;

the switch device and the filter elements, and the switch device and the first inductance element being respectively connected via connecting lines formed in the multi-layer insulating substrate; and layers provided with ground electrodes being disposed between the connecting lines formed on different layers.

In the second and third high-frequency devices, connecting lines for their circuit elements are not close to each other, preventing the deterioration of isolation characteristics and signal loss characteristics, suppressing parasitic reactance between the connecting lines, and thus making it easy for the first matching circuit to suppress impedance difference between the signal paths.

Each of the first to third high-frequency devices preferably comprises a second matching circuit in a signal path between the single port and the filter circuit, the second matching circuit comprising a second inductance element connected to the signal path, and the second inductance element being formed by electrode patterns beneath the filter elements in the insulating substrate. The electrode patterns are preferably formed on pluralities of layers, for example, in a meandering or coil form. In the multi-layer laminate substrate, electrode patterns on different layers are connected through via-holes. To prevent interference with electrode patterns constituting other circuit elements, etc., electrode patterns for the second inductance element are preferably formed in a region sandwiched by the upper and lower ground electrodes, such that they do not overlap the electrode patterns of the other circuit elements. Electrode patterns of the second inductance element connected to different signal paths are also preferably formed to avoid overlap.

Each of the first to third high-frequency devices preferably comprises an LC filter circuit between at least one of the single ports and each corresponding transmission/reception circuit, the LC filter circuit comprising a third inductance element and a second capacitance element, the third inductance element and the second capacitance element being electrode patterns formed beneath the switch device in the insulating substrate.

Electrode patterns for the third inductance element and the second capacitance element are preferably formed on different layers. Because electrode patterns constituting inductance elements generally lower resistance, they should be thicker than those for capacitance elements, but the formation of electrode patterns with different thicknesses on the same layer needs a larger number of steps. Accordingly, electrode patterns for the third inductance element and the second capacitance element are preferably formed on different layers. Ground electrodes are preferably disposed between electrode patterns for the third inductance element and electrode patterns for the second capacitance element. More preferably, the third inductance element is formed in a region sandwiched by the upper and lower ground electrodes, such that they do not overlap the electrode patterns of the other circuit elements.

A bottom surface (rear surface) of the insulating substrate is provided with pluralities of terminals including high-frequency terminals for connection to the antenna and the transmission/reception circuits. High-frequency terminals connected to the reception circuits are preferably aligned on one side of a bottom surface of the insulating substrate. With such arrangement of terminals, connecting lines between the filter elements disposed on an upper surface of the insulating substrate and the reception circuits can be made shorter in the signal paths, suppressing signal loss, etc. When the filter elements are of an unbalanced-input, balanced-output type, the adjacent arrangement of high-frequency terminals outputting balanced signals provides paths for balanced signals from the filter circuits to the high-frequency terminals with a substantially equal length, avoiding the deterioration of phase balance.

With the antenna terminals formed on the other side of the switch device, the connection of the antenna terminal to the first matching circuit and the connection of the receiving terminals to the filter terminals are preferably conducted by connecting lines in the insulating multilayer substrate without overlap in a lamination direction. In this case, too, their connecting lines are not close to each other, avoiding the deterioration of isolation characteristics and signal loss characteristics, suppressing parasitic reactance between the connecting lines, and thus making it easy for the first matching circuit to suppress impedance difference between the signal paths.

The multiband communications apparatus of the present invention comprises the above high-frequency circuit part. The high-frequency circuit is connected to transmission/reception circuits comprising amplifiers and mixers for communications systems. The transmission/reception circuits may be contained in one package together with amplifiers, automatic power control circuits, etc.

DESCRIPTION OF THE BEST MODE OF THE INVENTION

The embodiments of the present invention will be explained in detail referring to the attached drawings, but the structures of a single-pole, multi-throw switch circuit, a matching circuit, a filter circuit, etc. are not restrictive, but may be modified variously within the scope of the present invention.

[1] First Embodiment

Figure 1:
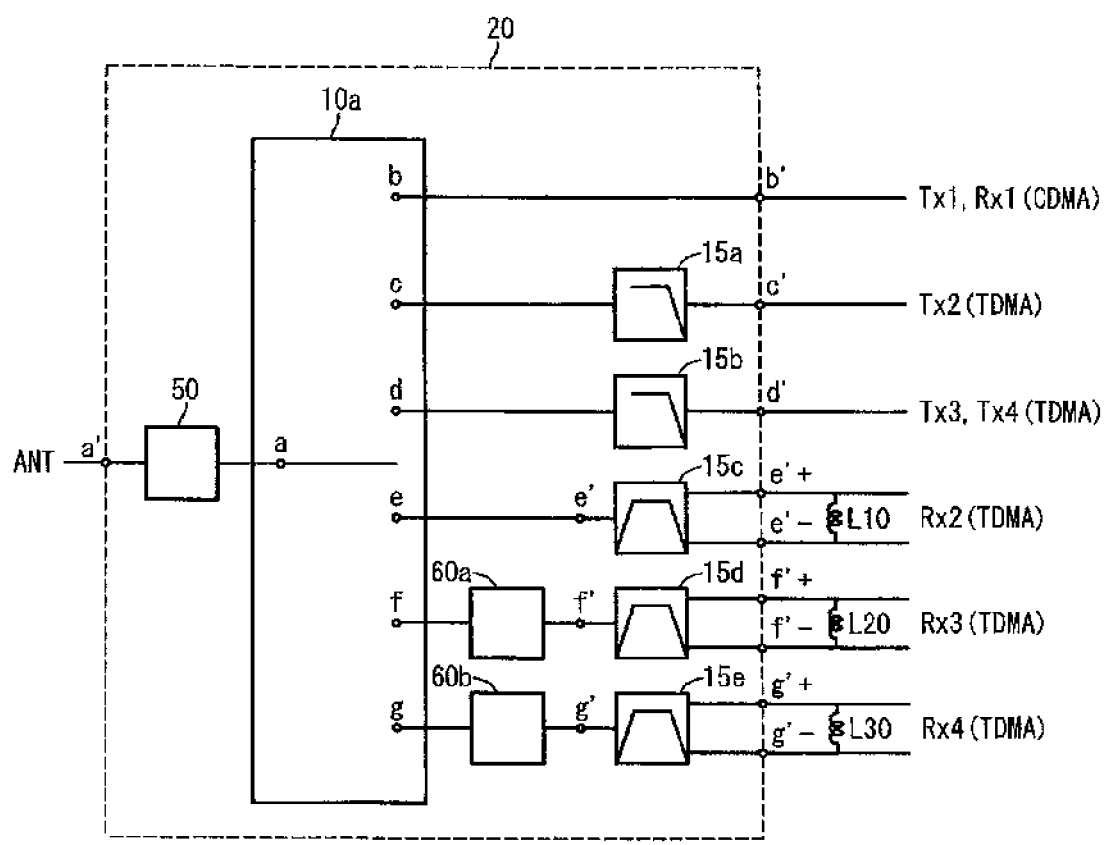
FIG. 1 is a block diagram showing a high-frequency circuit according to one embodiment of the present invention.
Figure 2:
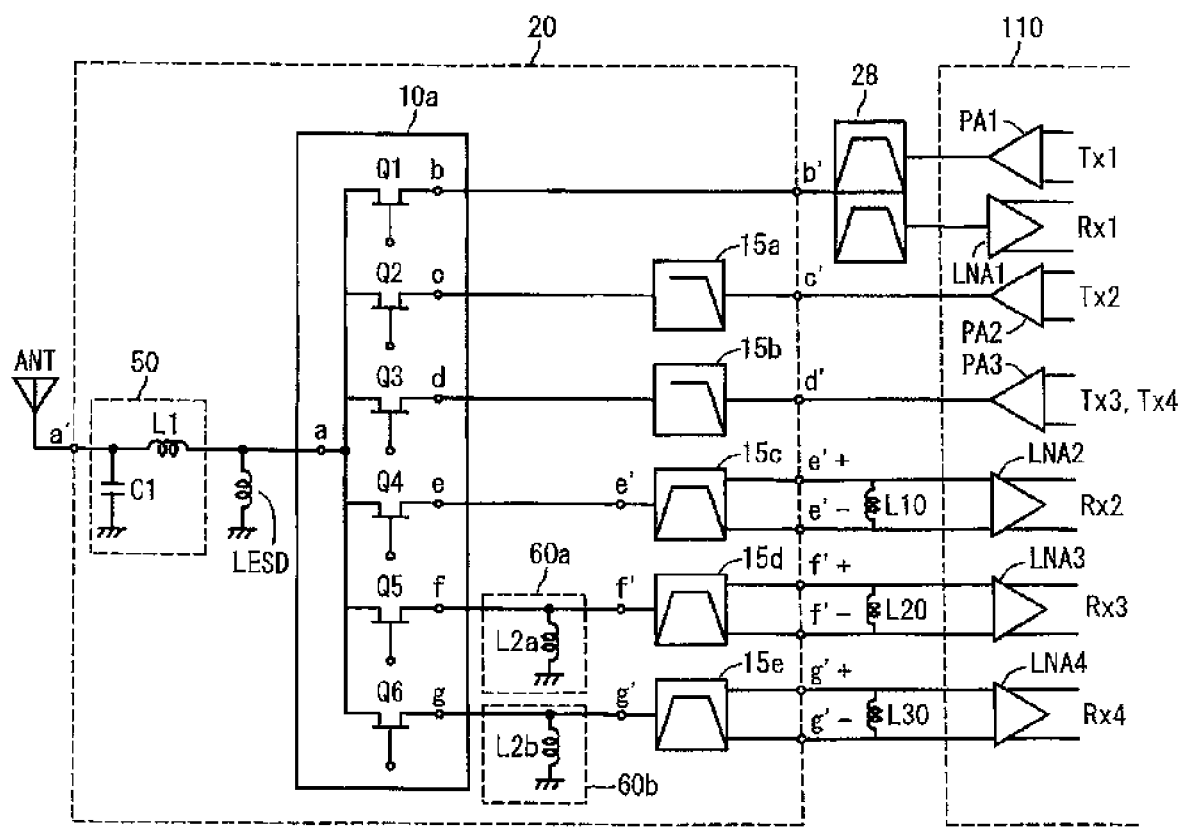
FIG. 2 is a view showing the equivalent circuit of a high-frequency circuit part in a multiband communications apparatus according to one embodiment of the present invention.

FIG. 1 shows a high-frequency circuit according to the first embodiment of the present invention, and FIG. 2 shows the equivalent circuit of the high-frequency circuit, when used as a multi-connection system in a quadband cell phone (multi-band communications apparatus) comprising three communications systems (GSM, PCS and DCS) of a TDMA system and one communications system (UMTS) of a CDMA system. The switch circuit may comprise a decoder, though not depicted.

This high-frequency circuit 20 comprising a single-pole, six-throw switch circuit 10a is disposed between a multiband antenna ANT, and a high-frequency amplifier PA1 and a low-noise amplifier LNA1 which are a front end (transmission/reception circuit) for the first communications system (UMTS), a high-frequency amplifier PA2 and a low-noise amplifier LNA2 which are a front end for the second communications system (GSM), a high-frequency amplifier PA3 and a low-noise amplifier LNA3 which are a front end for the third communications system (DCS), and a high-frequency amplifier PA3 and a low-noise amplifier LNA4 which are a front end for the fourth communications system (PCS), to switch transmission signals and received signals in each communications system. Though the high-frequency amplifier PA3 is commonly used in DCS and PCS in the front end 110 in this example, the high-frequency amplifier may be commonly used in UMTS and DCS, etc.

The single-pole, six-throw switch circuit 10a mainly comprises FET switch circuits Q1-Q6 each constituted by a field effect transistor FET. To improve electric power resistance and isolation characteristics, pluralities of FETs may be connected in series, or FETs may be connected to the ground. In this example, an inductance element LESD for protection from electrostatic surge is connected between a common port a of the single-pole, six-throw switch circuit 10a and the ground. The inductance element LESD has such impedance characteristics as not to influence each communications system, and inductance of 20-50 nH for attenuating large surge voltage between DC and 300 MHz.

All drains (or sources) of the FET switch circuits Q1-Q6 are connected to the common port a, which is connected to the multiband antenna ANT via a first matching circuit 50. The sources (or drains) of the FET switch circuits are connected to single ports b-g.

The first single port b is connected via a duplexer 28 to the high-frequency amplifier PA1 and the low-noise amplifier LNA1 for the first communications system (UMTS). The second and third single ports c, d are respectively connected via LC filter circuits 15a, 15b to the high-frequency amplifier PA2 for the second communications system (GSM) and the high-frequency amplifier PA3 for the third and fourth communications systems (DCS, PCS). The fourth to sixth single ports e-g are respectively connected via bandpass filters 15c-15e to the low-noise amplifiers LNA2-LNA4 for the second to fourth communications systems (GSM, DCS, PCS). Second matching circuits 60a, 60b are disposed between the single-pole, six-throw switch circuit 10a and the bandpass filters 15d, 15e, and each second matching circuit 60a, 60b comprises each second inductance element L2a, L2b.

In this example, unbalanced-input, balanced-output SAW filters are used as the bandpass filters 15c-15e, with inductance elements L10, L20, L30 for adjusting phase and amplitude balance disposed between the balanced output terminals. A capacitance element may be disposed between the balanced output terminals, and a reactance element may be disposed between each balanced output terminal and the ground.

The gate of the field effect transistor constituting each FET switch circuit is connected to a control voltage terminal via a resistor (not shown). The connection and disconnection of the high-frequency circuit by control voltage applied to the gate are shown in Table 1. With respect to the operation mode of each communications system UMTS, GSM, DCS, PCS in the multiband communications apparatus, Tx is a transmission mode, Rx is a reception mode, and TRx is a transmission or reception mode.

TABLE 1

| Connection Mode | Q1 | Q2 | Q3 | Q4 | Q5 | Q6 |
|---|---|---|---|---|---|---|
| Between Port a and Port b (UMTS TRx) | ON | OFF | OFF | OFF | OFF | OFF |
| Between Port a and Port c (GSM Tx) | OFF | ON | OFF | OFF | OFF | OFF |
| Between Port a and Port d (DCS/PCS Tx) | OFF | OFF | ON | OFF | OFF | OFF |
| Between Port a and Port e (GSM Rx) | OFF | OFF | OFF | ON | OFF | OFF |
| Between Port a and Port f (DCS Rx) | OFF | OFF | OFF | OFF | ON | OFF |
| Between Port a and Port g (PCS Rx) | OFF | OFF | OFF | OFF | OFF | ON |

For example, when transmission is conducted in the first communications system (UMTS), an external circuit (not shown) provides voltage turning the FET in the FET switch circuit Q1 to a conductive (ON) state, and voltage turning the FETs in the FET switch circuits Q2-Q6 to an unconductive (OFF) state. In this case, because only the FET switch Q1 is turned to an ON state, the transmitting signals of UMTS output from the front end 110 are radiated from the multiband antenna ANT.

When reception is conducted by the first communications system (UMTS), an external circuit (not shown) similarly provides voltage turning the FET in the FET switch circuit Q1 to a conductive (ON) state, and voltage turning the FETs in the FET circuit switches Q2-Q6 to an unconductive (OFF) state. As a result, the signals of UMTS received by the multiband antenna ANT are input to the front end 110 via the single-pole, six-throw switch circuit and the duplexer 28, amplified by the low-noise amplifier LNA1 in the front end 110, input to a downstream reception circuit (not shown), and subject to demodulation, etc.

In the above example, any one of four communications systems is used. For example, when a multimode operation including data communications by UMTS and telephoning by the communications systems of GSM, DCS, etc. are conducted, the FET switch circuit is controlled to connect the port a and the port b, as well as any one of other paths. In this case, too, the FET switch circuits connected in series to paths that need not be connected are controlled to an OFF state.

Figure 3:
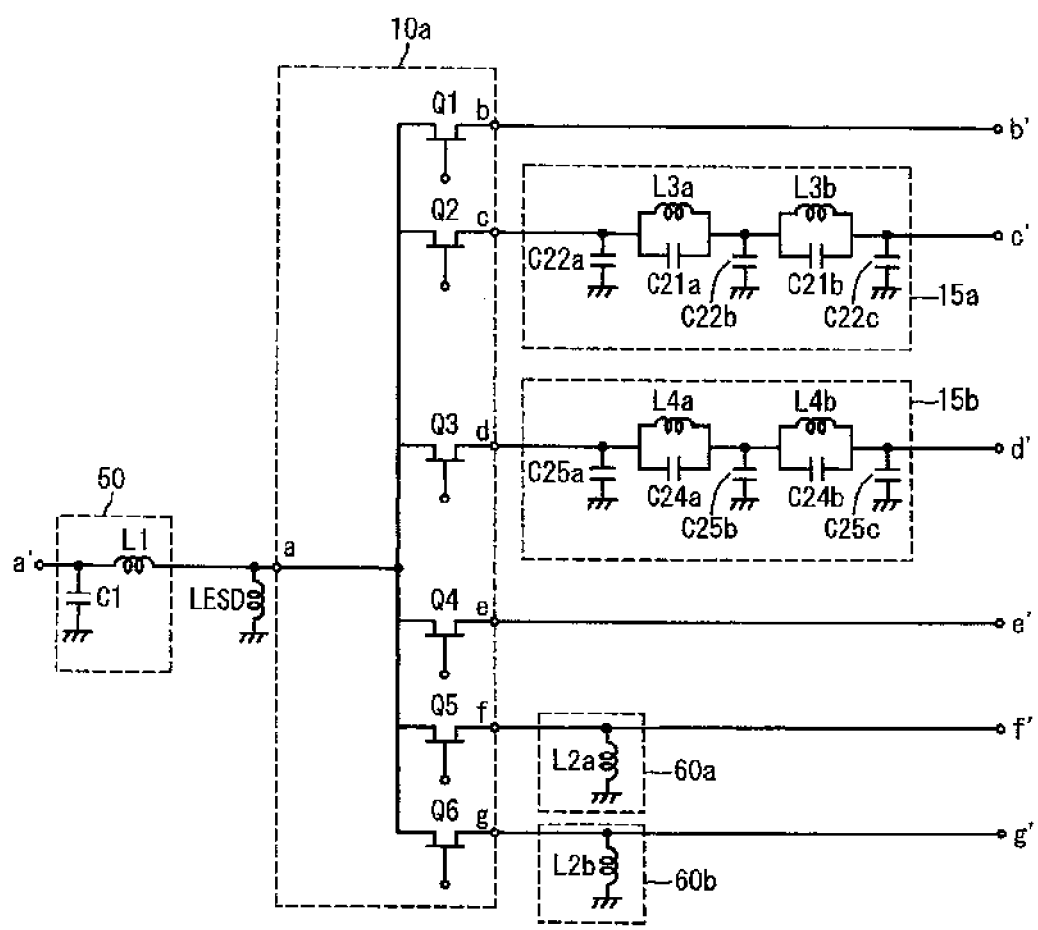
FIG. 3 is a view showing the equivalent circuit of a high-frequency circuit according to one embodiment of the present invention.

FIG. 3 shows the equivalent circuit of a high-frequency circuit comprising a single-pole, six-throw switch circuit 10a, a first matching circuit 50, second matching circuits 60a, 60b, and LC filter circuits 15a, 15b. In this example, each LC filter circuit is a multi-stage, π-type lowpass filter comprising third inductance elements L3a, L3b, L4a, L4b and second capacitance elements C21a, C21b, C22a, C22b, C22c, C24a, C24b, C25a, C25b, C25c, but it may be a single-stage filter, a band-pass filter circuit, or a notch filter circuit, etc.

Utilizing capacitance parasitic to a line connecting the single-pole, six-throw switch circuit 10a and the first matching circuit 50, the first capacitance element in the first matching circuit 50 may be omitted, though it is not preferable because it makes the adjustment of impedance difficult, and because it may deteriorate high-frequency characteristics such as signal loss and isolation, etc.

In the second matching circuits 60a, 60b, a capacitance element may be connected in parallel to a second inductance element L2a, L2b connected to a shunt path. Such structure provides the second inductance elements L2a, L2b with small inductance, increasing the degree of freedom of selecting inductance elements and their structures.

Figure 4:
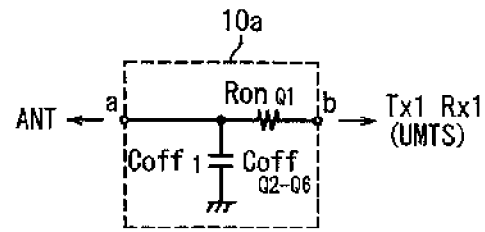
FIG. 4 is a view showing the equivalent circuit of a single-pole, multi-throw switch circuit controlled in an operation state.

FIG. 4 shows the equivalent circuit of the single-pole, six-throw switch circuit 10a when the port a and the port b are connected with the FET switch circuit Q1 controlled in an ON state, and the FET switch circuits Q2-Q6 controlled in an OFF state. In FIG. 4, RonQ1 is a resistance component of the FET switch circuit Q1 in an ON state, and CoffI is an equivalent capacitance component obtained by synthesizing the equivalent capacitances CoffQ2-CoffQ6 of the FET switch circuits Q2-Q6 in an OFF state. The other paths may also be expressed by similar equivalent circuits despite different equivalent capacitance components.

Each signal path of the single-pole, six-throw switch circuit 10a was measured by a network analyzer to obtain a Smith chart. A sample having elements for the single-pole, six-throw switch circuit mounted to a resin substrate was used for measurement, but when elements having known S parameters are used, analysis may be conducted by a circuit simulator.

FIGS. 8-17 are Smith charts showing impedance in a frequency range of 500-2500 MHz viewed from the common port and the single port when the common port a and each single port b-f is connected in the single-pole, six-throw switch circuit 10a. In each figure, a black triangle mark shows a frequency of 824 MHz, the lower limit of GSM850, and a white triangle mark shows a frequency of 2170 MHz, the upper limit of UMTS Band1.

Figure 8A:
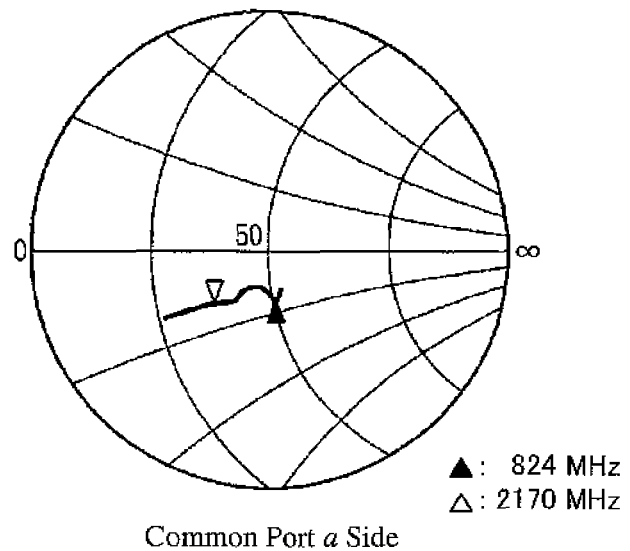
FIG. 8(a) is a Smith chart showing impedance viewed from the common port in a single-pole, six-throw switch circuit, when the transmission/reception paths of CDMA are controlled in an ON state.
Figure 8B:
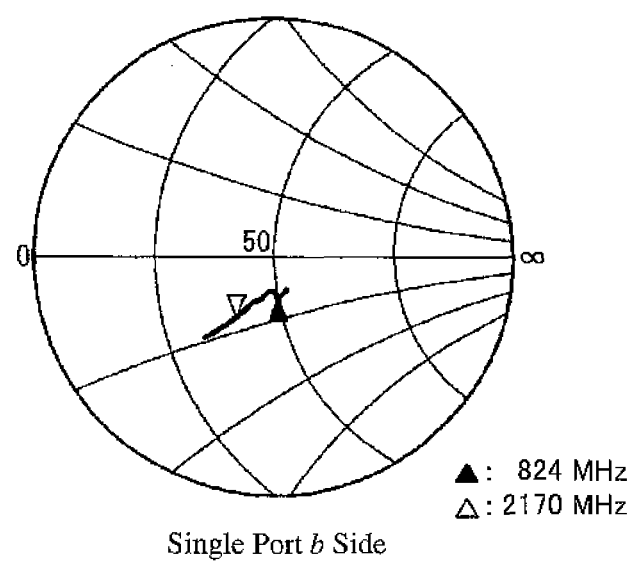
FIG. 8(b) is a Smith chart showing impedance viewed from the single port in a single-pole, six-throw switch circuit, when the transmission/reception paths of CDMA are controlled in an ON state.
Figure 9A:
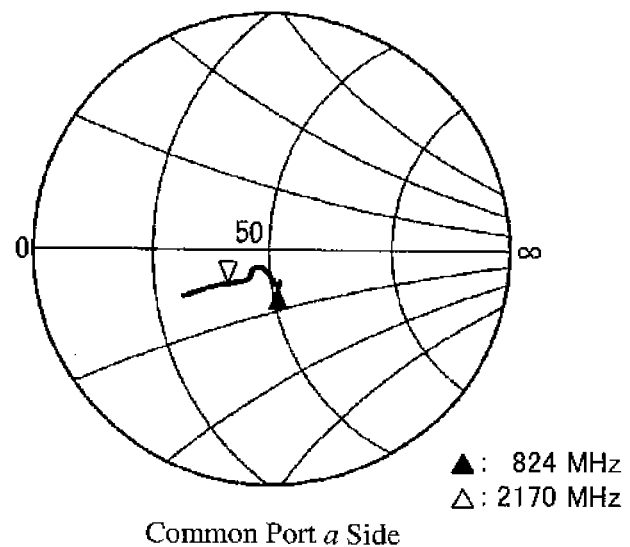
FIG. 9(a) is a Smith chart showing impedance viewed from the common port in a single-pole, six-throw switch circuit, when the transmission paths of TDMA are controlled in an ON state.
Figure 9B:
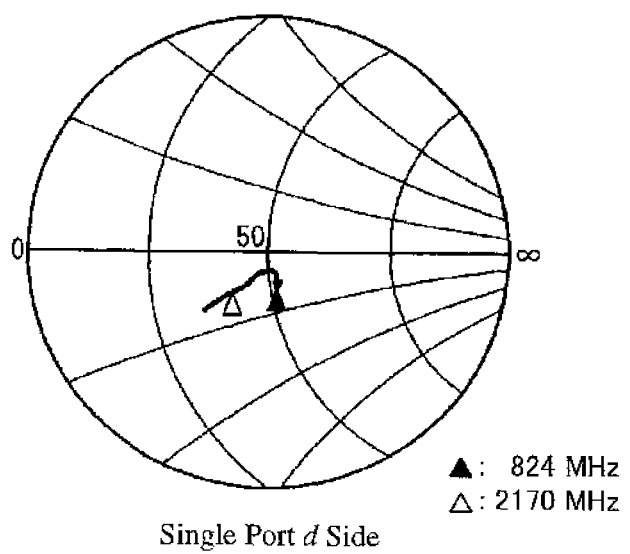
FIG. 9(b) is a Smith chart showing impedance viewed from the single port in a single-pole, six-throw switch circuit, when the transmission paths of TDMA are controlled in an ON state.
Figure 10A:
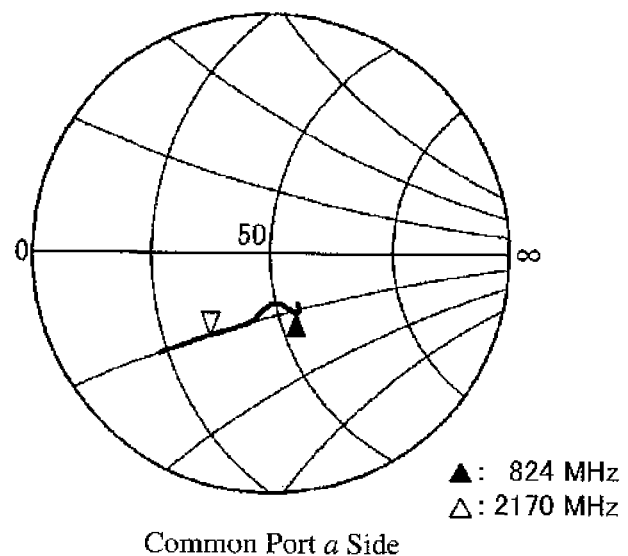
FIG. 10(a) is a Smith chart showing impedance viewed from the common port in a single-pole, six-throw switch circuit, when the reception paths of TDMA are controlled in an ON state.
Figure 10B:
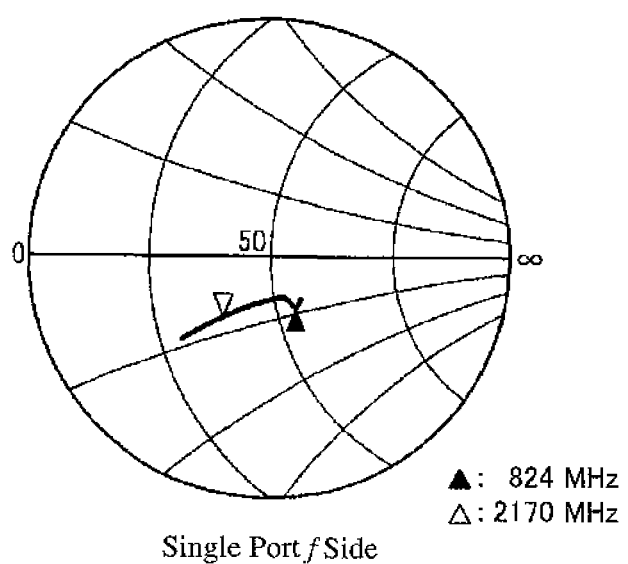
FIG. 10(b) is a Smith chart showing impedance viewed from the single port in a single-pole, six-throw switch circuit, when the reception paths of TDMA are controlled in an ON state.

FIGS. 8-10 are Smith charts showing impedances when the single-pole, six-throw switch circuit 10a was used alone. FIGS. 8(a) and 8(b) show impedance viewed from the common port a and the first single port b when the port a and the port b are connected. FIGS. 9(a) and 9(b) show impedance viewed from the common port a and the third single port d when the port a and the port d are connected. FIGS. 10(a) and 10(b) show impedance viewed from the common port a and the fifth single port f when the port a and the port f are connected.

In all cases, impedance viewed from the common port and the single port decreases as the frequency increases, deviating from the standardized impedance (50Ω). Particularly in higher frequency bands, increase in VSWR and insertion loss was confirmed. Also, because the signal paths have different equivalent capacitance components, different impedance loci are obtained depending on the single ports connected. The equivalent capacitance component Coff1 was about 0.5 pF when the common port a and the first single port b were connected.

Figure 5:
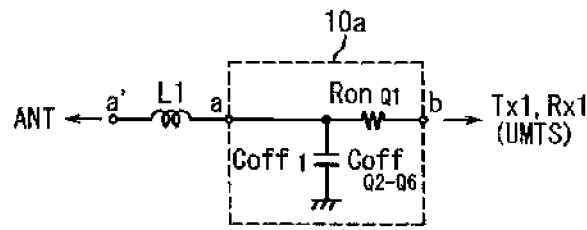
FIG. 5 is a view showing the equivalent circuit of a single-pole, six-throw switch circuit, whose common port is series-connected to an inductance element.
Figure 11A:
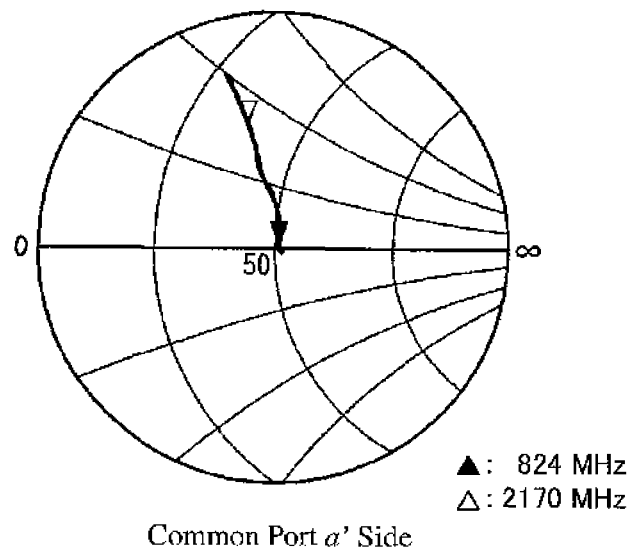
FIG. 11(a) is a Smith chart showing impedance viewed from the common port in a single-pole, six-throw switch circuit whose common port is connected in series to an inductance element, when the transmission/reception paths of CDMA are controlled in an ON state.
Figure 11B:
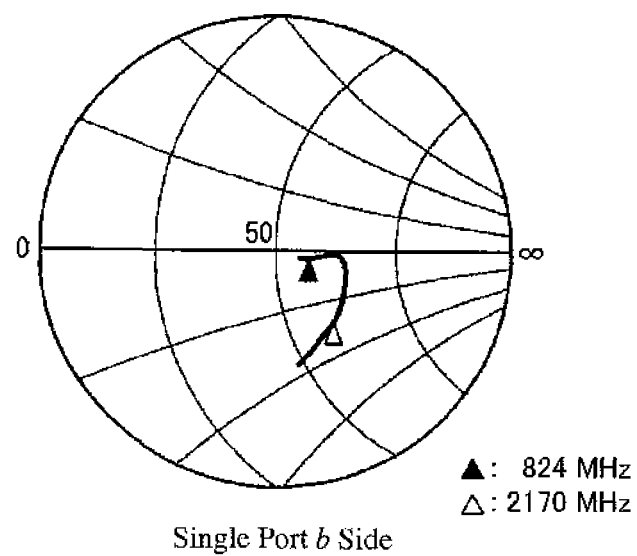
FIG. 11(b) is a Smith chart showing impedance viewed from the single port in a single-pole, six-throw switch circuit whose common port is connected in series to an inductance element, when the transmission/reception paths of CDMA are controlled in an ON state.
Figure 12A:
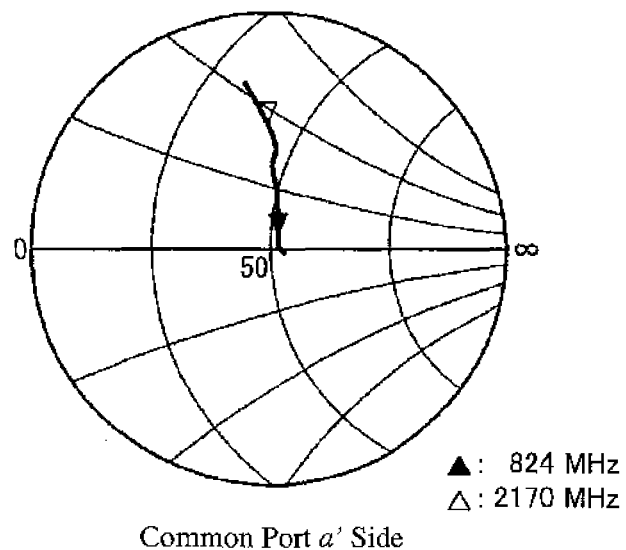
FIG. 12(a) is a Smith chart showing impedance viewed from the common port in a single-pole, six-throw switch circuit whose common port is connected in series to an inductance element, when the transmission paths of TDMA are controlled in an ON state.
Figure 12B:
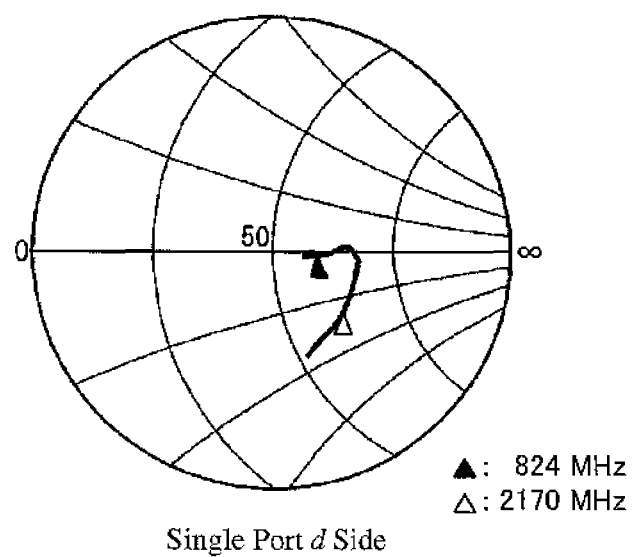
FIG. 12(b) is a Smith chart showing impedance viewed from the single port in a single-pole, six-throw switch circuit whose common port is connected in series to an inductance element, when the transmission paths of TDMA are controlled in an ON state.
Figure 13A:
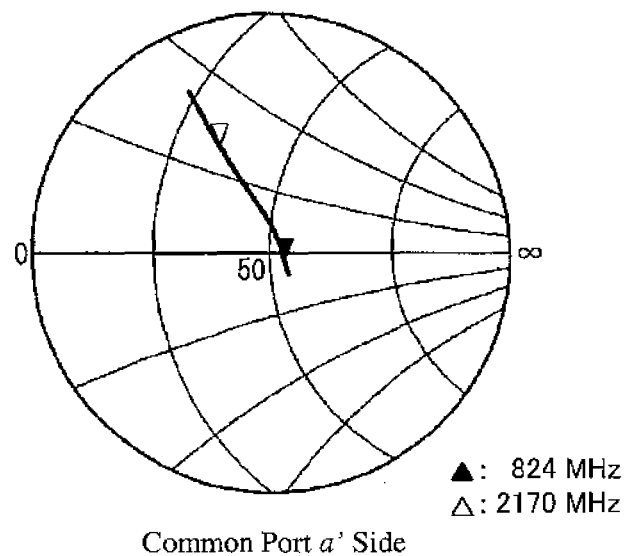
FIG. 13(a) is a Smith chart showing impedance viewed from the common port in a single-pole, six-throw switch circuit whose common port is connected in series to an inductance element, when the reception paths of TDMA are controlled in an ON state.
Figure 13B:
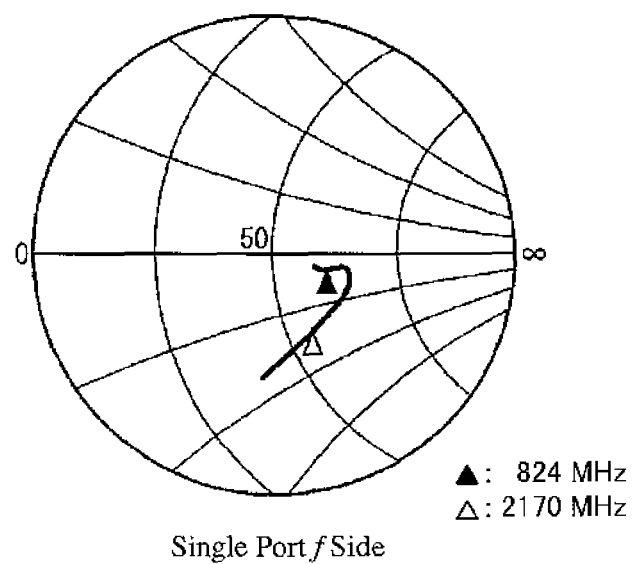
FIG. 13(b) is a Smith chart showing impedance viewed from the single port in a single-pole, six-throw switch circuit whose common port is connected in series to an inductance element, when the reception paths of TDMA are controlled in an ON state.

Impedance was examined when an inductance element L1 was series-connected to the common port a of the single-pole, six-throw switch circuit 10a. FIG. 5 shows the equivalent circuit of the single-pole, six-throw switch circuit 10a when the port a and the port b are connected with the FET switch circuit Q1 controlled in an ON state, and the FET switch circuits Q2-Q6 controlled in an OFF state. FIGS. 11-13 are Smith charts showing impedances when an inductance element of 2.2 nH is series-connected to the common port a of the single-pole, six-throw switch circuit 10a. FIGS. 11(a) and 11(b) show impedance viewed from the common port a' and the first single port b when the port a and the port b are connected. FIGS. 12(a) and 12(b) show impedance viewed from the common port a' and the third single port d when the port a and the port d are connected. FIGS. 13(a) and 13(b)

show impedance viewed from the common port a' and the fifth single port f when the port a and the port f are connected. In any signal paths, the common port exhibited inductive impedance, and the single port exhibited capacitive impedance, in higher frequency bands.

As is clear from FIGS. 11-13, impedance loci on the Smith charts rotated clockwise on the common port side, and counterclockwise on the single port side by the connection of the inductance element L1. A chip inductor having inductance of 1.0 nH or less provided slight improvement of VSWR, and the use of an inductance element with larger inductance provided larger phase rotation, increasing VSWR in higher frequency bands. It is thus clear that the series connection of an inductance element to the common port fails to provide expected improvement in VSWR.

Figure 6:
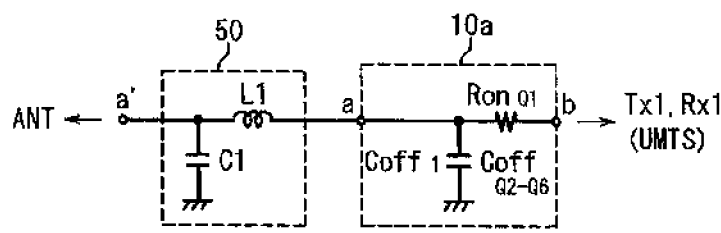
FIG. 6 is a view showing the equivalent circuit of a single-pole, six-throw switch circuit, whose common port is series-connected to a first matching circuit.

FIG. 6 shows the equivalent circuit of the single-pole, six-throw switch circuit 10a, whose common port a is connected to a first matching circuit 50 comprising a first inductance element L1 series-connected to the common port a, and a first grounded capacitance element C1 connected to the multiband antenna circuit. In this equivalent circuit, the port a and the port b are connected with the FET switch circuit Q1 controlled in an ON state, and the FET switch circuits Q2-Q6 controlled in an OFF state.

Figure 14A:
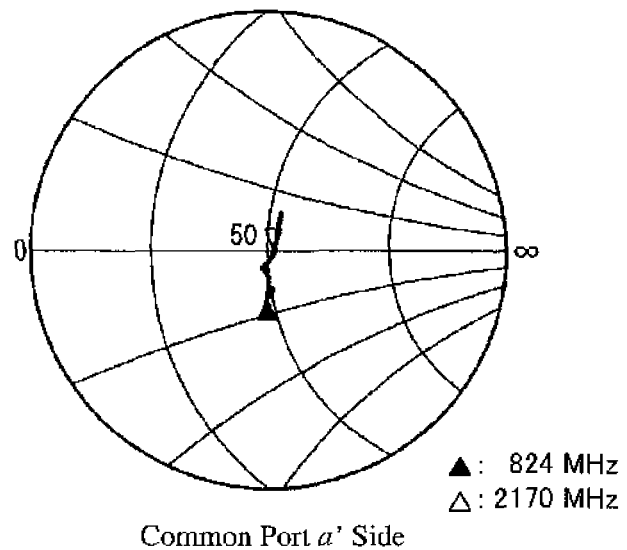
FIG. 14(a) is a Smith chart showing impedance viewed from the common port in a single-pole, six-throw switch circuit whose common port is connected to a first matching circuit, when the transmission/reception paths of CDMA are controlled in an ON state.
Figure 14B:
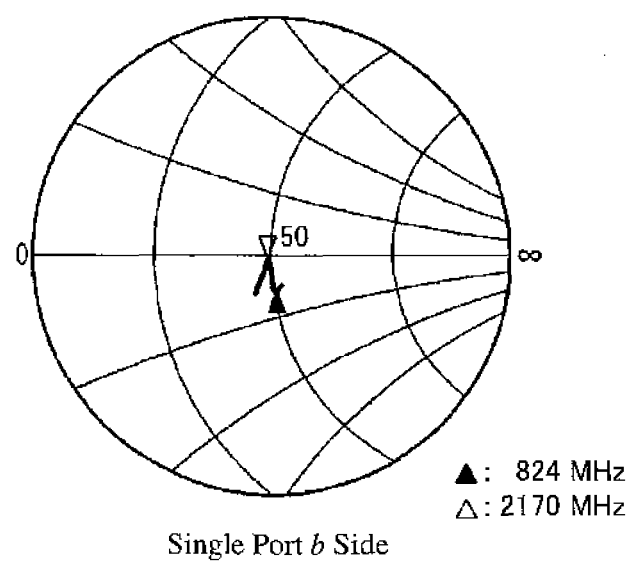
FIG. 14(b) is a Smith chart showing impedance viewed from the single port in a single-pole, six-throw switch circuit whose common port is connected to a first matching circuit, when the transmission/reception paths of CDMA are controlled in an ON state.
Figure 15A:
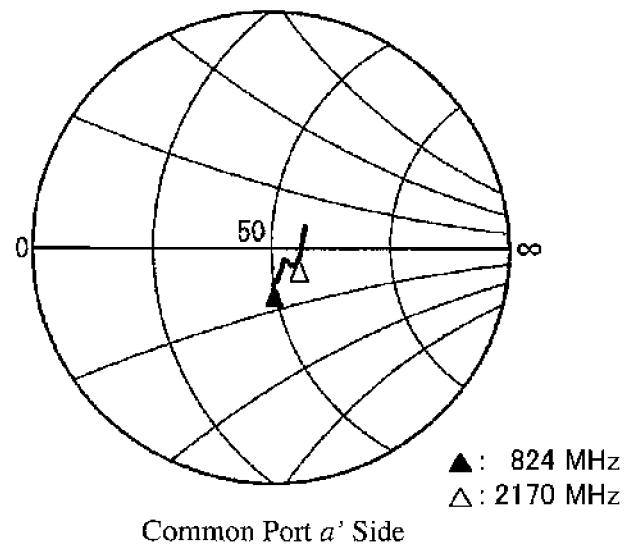
FIG. 15(a) is a Smith chart showing impedance viewed from the common port in a single-pole, six-throw switch circuit whose common port is connected to a first matching circuit, when the transmission paths of TDMA are controlled in an ON state.
Figure 15B:
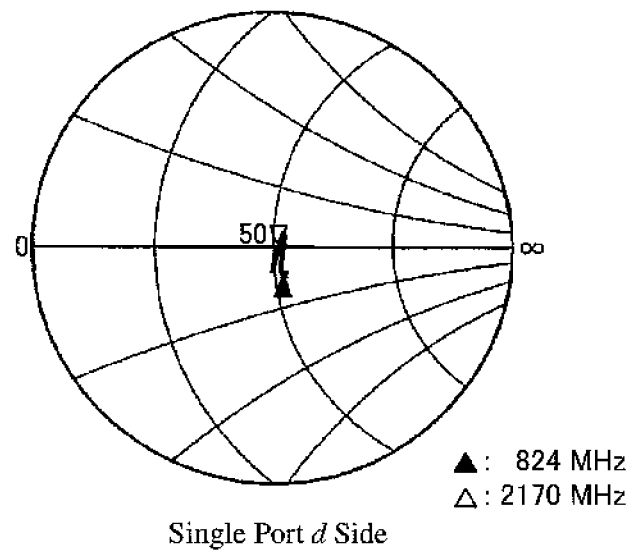
FIG. 15(b) is a Smith chart showing impedance viewed from the single port in a single-pole, six-throw switch circuit whose common port is connected to a first matching circuit, when the transmission paths of TDMA are controlled in an ON state.
Figure 16A:
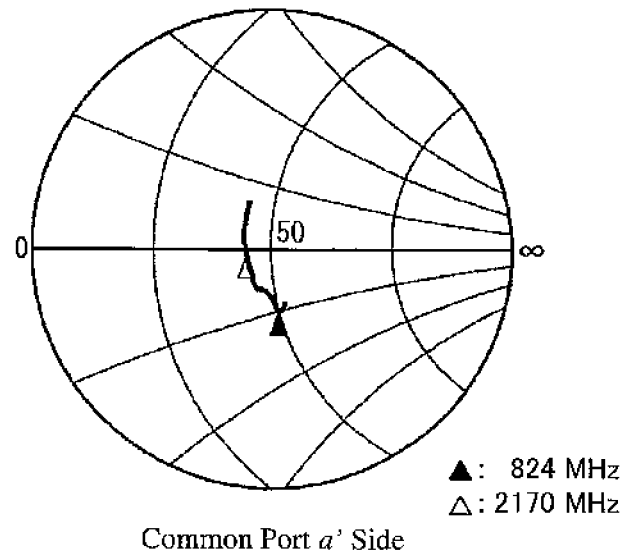
FIG. 16(a) is a Smith chart showing impedance viewed from the common port in a single-pole, six-throw switch circuit whose common port is connected to a first matching circuit, when the reception paths of TDMA are controlled in an ON state.
Figure 16B:
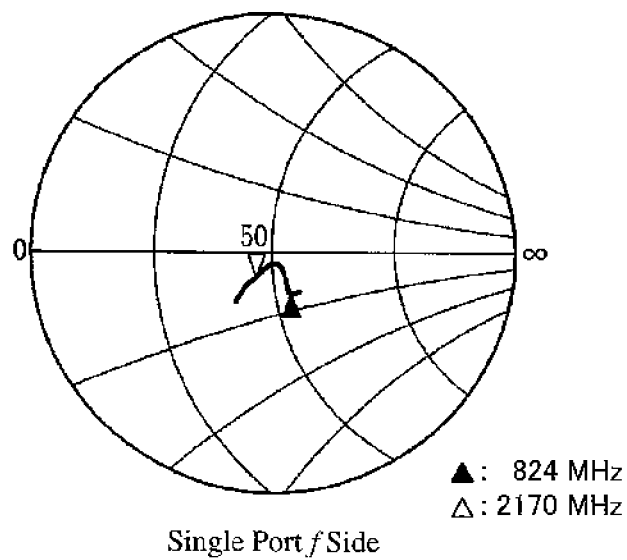
FIG. 16(b) is a Smith chart showing impedance viewed from the single port in a single-pole, six-throw switch circuit whose common port is connected to a first matching circuit, when the reception paths of TDMA are controlled in an ON state.

FIGS. 14-16 are Smith charts showing impedance when the first inductance element L1 of 2.2 nH is series-connected to the common port a of the single-pole, six-throw switch circuit 10a, and when the first capacitance element C1 of 0.8 pF is connected to the first inductance element L1 on the multiband antenna circuit side. FIGS. 14(a) and 14(b) show impedance viewed from the common port a' and the first single port b when the port a and the port b are connected. FIGS. 15(a) and 15(b) show impedance viewed from the common port a' and the third single port d when the port a and the port d are connected. FIGS. 16(a) and 16(b) show impedance viewed from the common port a' and the fifth single port f when the port a and the port f are connected. In any paths, impedance was concentrated to 50Ω in higher frequency bands on both common port side and single port side than when only the single-pole, six-throw switch circuit was used, or when only an inductance element was connected to its common port a. In this example in which the first matching circuit 50 comprising the first inductance element L1 and the first capacitance element C1 was connected to the common port a of the single-pole, six-throw switch circuit 10a, impedance was well concentrated to 50Ω in transmitting and receiving frequency bands on both of the common port side and the single port side.

Figure 7:
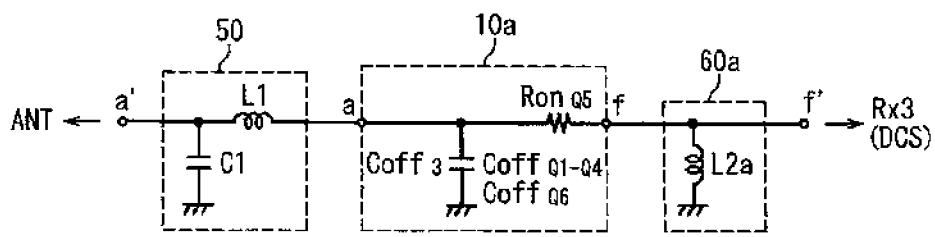
FIG. 7 is a view showing the equivalent circuit of a single-pole, six-throw switch circuit with a common port connected to a first matching circuit and a single port connected to a second matching circuit.
Figure 17A:
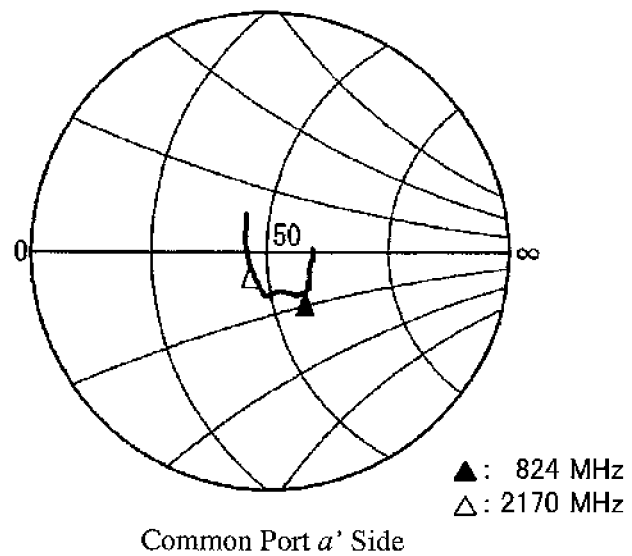
FIG. 17(a) is a Smith chart showing impedance viewed from the common port in a single-pole, six-throw switch circuit whose common is connected to a first matching circuit, and whose single port is connected to a second matching circuit, when the reception paths of TDMA are controlled in an ON state.
Figure 17B:
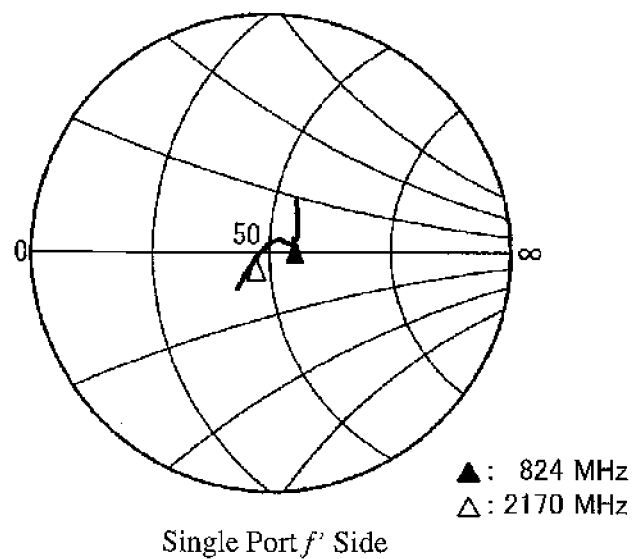
FIG. 17(b) is a Smith chart showing impedance viewed from the single port in a single-pole, six-throw switch circuit whose common port is connected to a first matching circuit, and whose single port is connected to a second matching circuit, when the reception paths of TDMA are controlled in an ON state.

FIG. 7 shows the equivalent circuit of a single-pole, six-throw switch circuit 10a, whose common port a is connected to a first matching circuit 50, and whose fifth single port f is connected to a second matching circuit 60a comprising a grounded second inductance element L2a. In this equivalent circuit, the port a and the port f are connected via the FET switch circuit Q5 of the single-pole, six-throw switch circuit 10a controlled in an ON state, and the FET switch circuits Q1-Q4, Q6 controlled in an OFF state. RonQ5 is a resistance component of the FET switch circuit Q5 in an ON state, and Coff3 is an equivalent capacitance component obtained by synthesizing the equivalent capacitances CoffQ1 to CoffQ4 and CoffQ6 of the FET switches Q1-Q4, Q6 in an OFF state. FIGS. 17(a) and 17(b) show impedance viewed from the common port a' and the fifth single port f when the port a and the port f are connected. Having the second matching circuit 60a constituted by the grounded inductance element in addition to the first matching circuit 50, impedances on the common port side and on the single port side were concentrated to 50Ω.

The impedance in the above state is summarized in Tables 2 and 3. The addition of the first matching circuit, or the first matching circuit+the second matching circuit to the single-pole, six-throw switch circuit clearly provides more impedance matching to 50Ω at each port.

TABLE 2

| | | Impedance viewed from common port | | | |
|---|---|---|---|---|---|
| Path | Frequency (GHz) | Only Single-Pole, Six-Throw Switch Circuit | First Inductance Element L1 | First Matching Circuit | First Matching Circuit + Second Matching Circuit |
| UMTS | 1.92 | 43.13 − j9.10 | 42.65 + j17.93 | 49.98 − j3.19 | — |
|  | 2.17 | 38.84 − j8.96 | 39.40 + j21.85 | 51.51 − j0.37 | — |
| DCS/PCS | 1.71 | 45.91 − j5.41 | 46.391 + j8.52 | 53.58 − j3.37 | — |
| Tx | 1.92 | 45.07 − j6.09 | 45.58 + j20.79 | 54.78 − j3.97 | — |
| DCS Rx | 1.805 | 43.45 − j13.16 | 43.95 + j12.16 | 46.24 − j7.05 | 48.41 − j8.98 |
|  | 1.88 | 42.50 − j13.21 | 43.01 + j12.23 | 46.20 − j6.34 | 48.09 − j8.33 |

TABLE 3

| | | Impedance viewed from single port | | | |
|---|---|---|---|---|---|
| Path | Frequency (GHz) | Only Single-Pole, Six-Throw Switch Circuit | First Inductance Element L1 | First Matching Circuit | First Matching Circuit + Second Matching Circuit |
| UMTS | 1.92 | 45.12 − j8.51 | 65.39 − j10.46 | 49.06 − j0.99 | — |
|  | 2.17 | 41.66 − j10.58 | 60.42 − j18.47 | 48.52 − j3.22 | — |
| DCS/PCS | 1.71 | 49.79 − j4.08 | 69.98 − j2.53 | 52.27 + j2.95 | — |
| Tx | 1.92 | 47.33 − j4.78 | 68.40 + j7.64 | 51.72 + j2.91 | — |
| DCS Rx | 1.805 | 47.59 − j8.57 | 66.12 + j10.39 | 50.98 − j2.12 | 50.92 − j2.75 |
|  | 1.88 | 46.23 − j8.66 | 64.57 + j12.02 | 50.27 − j2.15 | 50.25 − j2.40 |

Figure 18A:
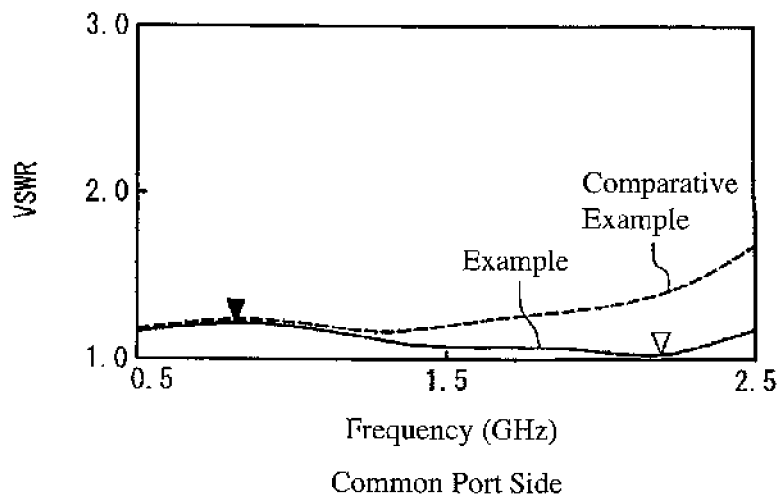
FIG. 18(a) is a graph showing VSWR characteristics in the paths of CDMA [UMTS] on the common port side, in the high-frequency circuit of the present invention and a single-pole, six-throw switch circuit.
Figure 18B:
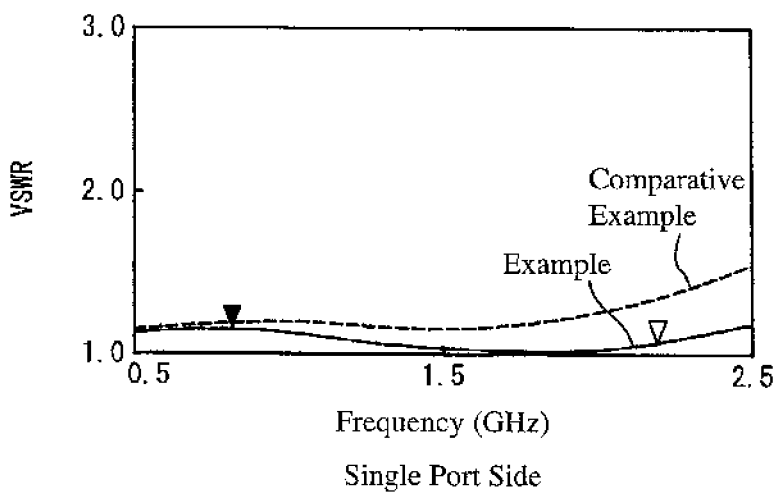
FIG. 18(b) is a graph showing VSWR characteristics in the paths of CDMA [UMTS] on the single port side, in the high-frequency circuit of the present invention and a single-pole, six-throw switch circuit.
Figure 19A:
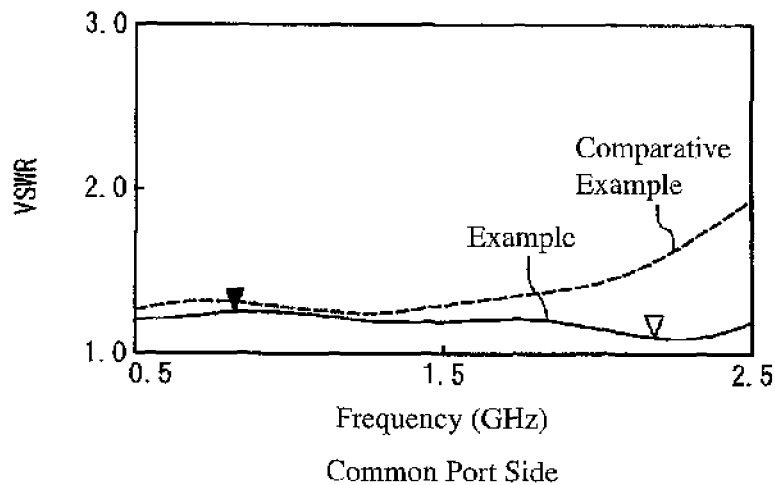
FIG. 19(a) is a graph showing VSWR characteristics in the paths [DCS/PCSTx] of TDMA on the common port side, in the high-frequency circuit of the present invention and a single-pole, six-throw switch circuit.
Figure 19B:
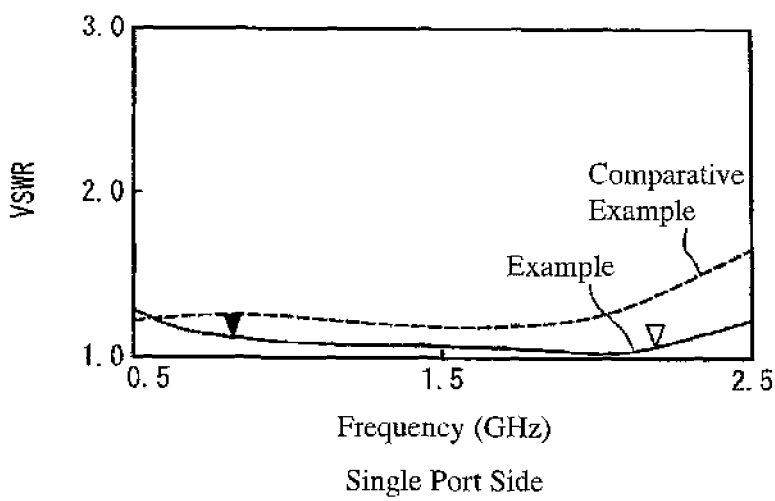
FIG. 19(b) is a graph showing VSWR characteristics in the paths [DCS/PCSTx] of TDMA on the single port side, in the high-frequency circuit of the present invention and a single-pole, six-throw switch circuit.

FIGS. 18(*a*) and 18(*b*) show VSWR characteristics on the common port side and on the single port side in the path of UMTS, and FIGS. 19(*a*) and 19(*b*) show VSWR characteristics on the common port side and on the single port side in the path of DCS Rx. In the figures, the solid line indicates VSWR characteristics in Example having the first matching circuit 50, and the broken line indicates VSWR characteristics in Comparative Example using only the single-pole, six-throw switch circuit 10*a*. Example had a wider frequency band of low VSWR than when only the single-pole, six-throw switch circuit was used, providing VSWR of 1.3 or less in as wide a frequency band as 824 MHz to 2170 MHz.

[2] Second Embodiment

Figure 20:
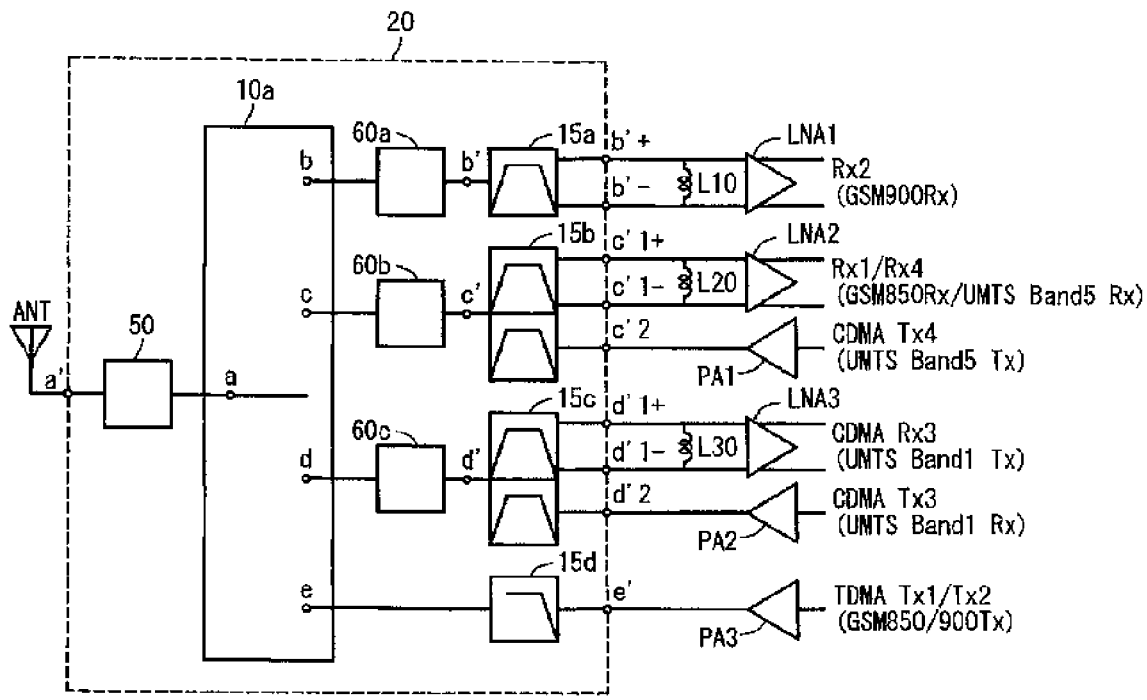
FIG. 20 is a block diagram showing a high-frequency circuit according to another embodiment of the present invention.

FIG. 20 shows a high-frequency circuit according to the second embodiment of the present invention for use in quad-band cell phones having two communications systems (GSM850, GSM900) using a TDMA system and two communications systems (UMTS Band1, Band5) using a CDMA system, as a multiband communications apparatus. The single-pole, multi-throw switch circuit may have a decoder.

The high-frequency circuit 20 comprising a single-pole, four-throw switch circuit 10*a* is disposed between a multi-band antenna ANT, and a high-frequency amplifier PA1 and a low-noise amplifier LNA2, a front end for the first communications system of a CDMA system (UMTS Band5), a high-frequency amplifier PA2 and a low-noise amplifier LNA3, a front end for the second communications system of a CDMA system (UMTS Band1), a high-frequency amplifier PA3 and a low-noise amplifier LNA1, a front end for the first communications system of a TDMA system (GSM900), and a high-frequency amplifier PA3 and a low-noise amplifier LNA2, a front end for the second communications system of a TDMA system (GSM850), to switch transmission signals and received signals in each communications system.

The first single port b is connected to the low-noise amplifier LNA1 for the first communications system of the TDMA system (GSM900) via a second matching circuit 60*a* and a bandpass filter 15*a*. The second single port e is connected to the high-frequency amplifier PA3 commonly used for the first communications system (GSM900) and the second communications system (GSM850) of the TDMA system, via an LC filter circuit 15*d*. The third single port c is connected to the high-frequency amplifier PA1 used for the first communications system of the CDMA system (UMTS Band5), and the low-noise amplifier LNA2 commonly used for the first communications system of the CDMA system and the second communications system of the TDMA system (GSM850), via a second matching circuit 60*b* and a first duplexer 15*b*. The fourth single port d is connected to the high-frequency amplifier PA2 for the second communications system of the CDMA system (UMTS Band1), and the low-noise amplifier LNA3 for the second communications system of the CDMA system, via a second matching circuit 60*c* and a second duplexer 15*c*.

In this example, unbalanced-input, -balanced-output SAW or BAW filters, or BPAW filters are used for the bandpass filter 15*a* and duplexers 15*b*, 15*c*, and impedance-matching inductance elements L10-L30 are disposed between the balanced output terminals.

A gate of FET constituting each FET switch Q1-Q4 is connected to a control voltage terminal (not shown) via a resistor (not shown). The connection state of the high-frequency circuit with control voltage applied to the gate is summarized in Table 4.

TABLE 4

| Connection Mode | Q1 | Q2 | Q3 | Q4 |
| --- | --- | --- | --- | --- |
| Between Port a and Port b (GSM900 Rx) | ON | OFF | OFF | OFF |
| Between Port a and Port c (GSM850/UMTS Band5 Rx) | OFF | ON | OFF | OFF |
| Between Port a and Port c (UMTS Band5 Tx) | OFF | ON | OFF | OFF |
| Between Port a and Port d (UMTS Band1 Rx) | OFF | OFF | ON | OFF |
| Between Port a and Port d (UMTS Band1 Tx) | OFF | OFF | ON | OFF |
| Between Port a and Port d (GSM850/900 Tx) | OFF | OFF | OFF | ON |

For example, when transmission is conducted by the first communications system of the CDMA system (UMTS Band5), an external circuit (not shown) provides voltage for turning the FET of the FET switch circuit Q2 to a conductive (ON) state, and voltage for turning the FETs of the FET switch circuits Q1, Q3, Q4 to an unconductive (OFF) state. In this case, because only the FET switch Q2 is put in an ON state, the transmitting signals of UMTS Band5 output from the front end comprising the high-frequency amplifier PA1 pass through the duplexer circuit 15*b* and the single-pole, four-throw switch circuit 10*a* to be radiated from the multiband antenna ANT.

When reception is conducted by the first communications system (UMTS Band5), an external circuit (not shown) similarly provides voltage for turning the FETs of the FET switch circuit Q2 to a conductive (ON) state, and voltage for turning the FET of the FET switches Q1, Q3, Q4 to an unconductive (OFF) state. As a result, the signals of UMTS received by the multiband antenna ANT are input via the single-pole, four-throw switch circuit 10*a* and the duplexer 15*b* to the low-noise amplifier LNA2 for amplification, and then input to a downstream reception circuit (not shown), and subject to demodulation, etc.

When transmission is conducted by the second communications system of the TDMA system (GSM850), voltage for turning the FET of the FET switch Q4 to a conductive (ON) state, and voltage for turning the FETs of the FET switch circuits Q1-Q3 to an unconductive (OFF) state are provided. In the case of reception, voltage for turning the FET of the FET switch circuit Q2 to a conductive (ON) state, and voltage for turning the FET of the FET switches Q1, Q3, Q4 to an unconductive (OFF) state are provided.

Figure 21:
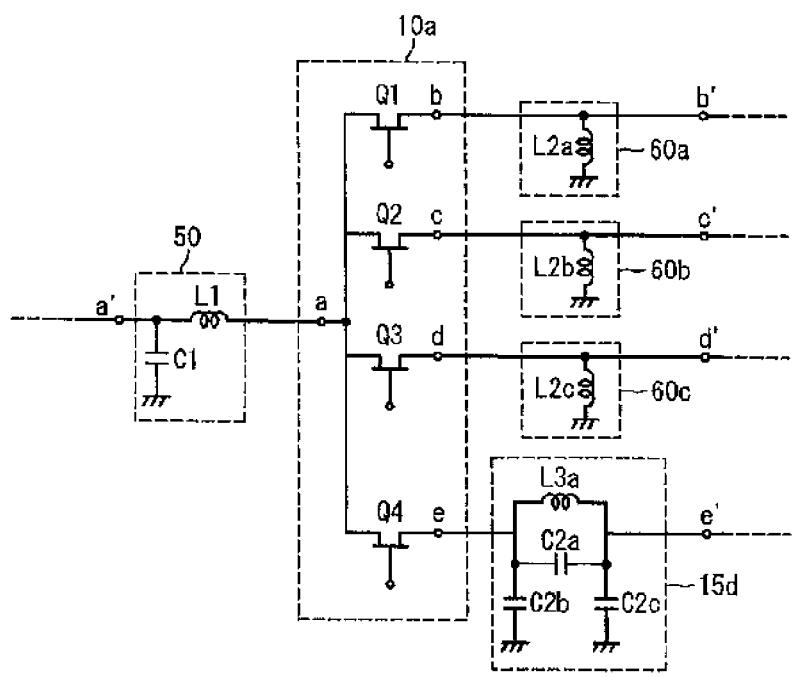
FIG. 21 is a view showing the equivalent circuit of a high-frequency circuit according to another embodiment of the present invention.

FIG. 21 shows the equivalent circuit of a high-frequency circuit comprising a single-pole, four-throw switch circuit 10*a*, a first matching circuit 50, second matching circuits 60*a*-60*c*, and an LC filter circuit 15*d*. In this example, with part of signal paths and transmission/reception circuits of the single-pole, multi-throw switch circuit 10*a* commonly used for different communications systems, equivalent capacitance can be reduced when the FET switch circuit is in an OFF state. Further, with the first matching circuit 50 connected to the common port a, impedance viewed from the common port and the single port is concentrated to 50Ω. The impedance viewed from the single port can be adjusted by the second matching circuits 60*a*, 60*b*, 60*c* comprising the grounded inductance elements L2*a*, L2*b*, L2*c*. This structure provides a wider frequency band of low VSWR than when only the single-pole, four-throw switch circuit is used, achieving VSWR of 1.3 or less in as wide a frequency band as 824 MHz to 2170 MHz.

Figure 22:
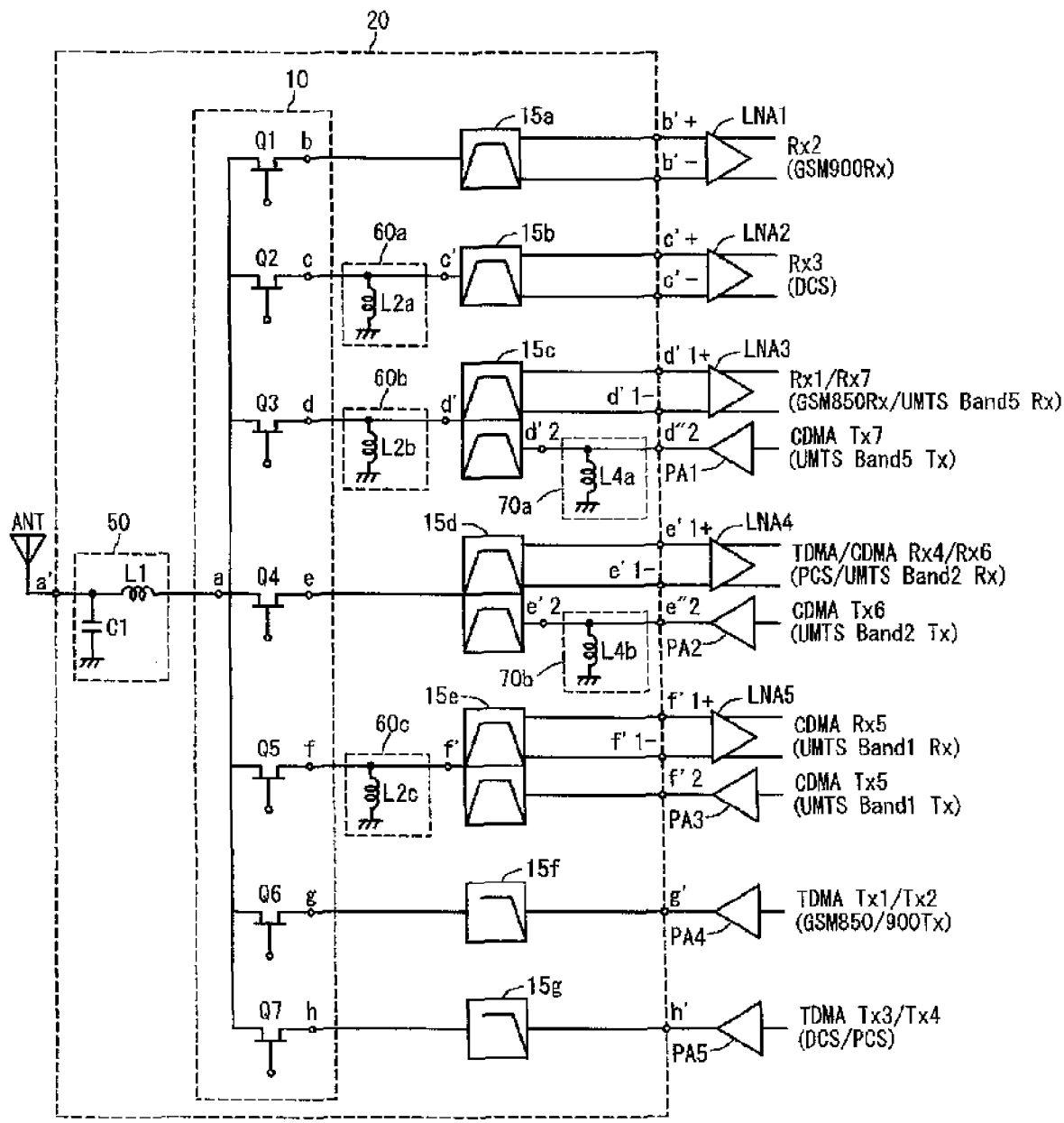
FIG. 22 is a view showing the equivalent circuit of a high-frequency circuit according to a further embodiment of the present invention.

FIG. 22 shows a further example of the high-frequency circuits of the present invention used in the multiband communications apparatuses. The high-frequency circuit 20 in this example comprises a multi-connection, single-pole, seven-throw switch circuit 10a for four communications systems GSM850, GSM900, GSM1800, GSM1900 using a TDMA system, and three communications systems UMTS Band1, Band2, Band5 using a CDMA system.

The high-frequency circuit 20 is disposed between an multiband antenna ANT, and a high-frequency amplifier PA1 and a low-noise amplifier LNA3, a front end for the first communications system of the CDMA system (UMTS Band5), a high-frequency amplifier PA3 and a low-noise amplifier LNA5, a front end for the second communications system of the CDMA system (UMTS Band1), a high-frequency amplifier PA2 and a low-noise amplifier LNA4, a front end for the third communications system (UMTS Band2) of the CDMA system, a high-frequency amplifier PA4 and a low-noise amplifier LNA1, a front end for the first communications system of the TDMA system (GSM900), a high-frequency amplifier PA4 and a low-noise amplifier LNA3, a front end for the second communications system of the TDMA system (GSM850), a high-frequency amplifier PA5 and a low-noise amplifier LNA2, a front end for the third communications system (DCS) of the TDMA system, and a high-frequency amplifier PA5 and a low-noise amplifier LNA4, a front end for the fourth communications system (PCS) of the TDMA system, to switch transmission signals and received signals for each communications system.

In this example, the low-noise amplifier LNA3 is commonly used by the first communications system of the CDMA system (UMTS Band5) and the second communications system of the TDMA system (GSM850), the low-noise amplifier LNA4 is commonly used by the third communications system (UMTS Band2) of the CDMA system and the third communications system (PCS) of the TDMA system, the high-frequency amplifier PA4 is commonly used by the first and second communications systems of the TDMA system (GSM850/GSM900), and the high-frequency amplifier PA5 is commonly used by the third and fourth communications systems (DCS/PCS) of the TDMA system.

In this example, second matching circuits 60a, 60b, 60c are respectively connected between the single ports c, d, f of the single-pole, seven-throw switch circuit 10a and the bandpass filter 15b and the duplexers 15c, 15e, and third matching circuits 70a, 70b are respectively connected between the duplexers 15c, 15d and the high-frequency amplifiers PA1, PA2 of the transmission circuits.

The received signals usually have smaller power than that of the transmitting signals, and when the received signals are used as the balanced signals, the characteristics (phase balance, amplitude balance, etc.) of signals may be deteriorated by reactance parasitic to the connecting line. Thus, the receiving terminals of the bandpass filters and the duplexers are gathered in a certain region, to make lines connecting to the reception circuits as short as possible. On the other hand, because the transmission paths are separated from the reception paths for higher isolation, connecting lines between the duplexers and the transmission circuits tend to be longer. A longer connecting line provides larger reactance, making it more likely to cause impedance mismatching. Particularly parasitic capacitance generated between the connecting line and the ground tends to be larger. In this example, the influence of parasitic capacitance is reduced by the third matching circuits 70a, 70b comprising the grounded inductance elements L4a, L4b between the duplexers 15c, 15d and the transmission circuits.

In this example, impedance difference due to the equivalent capacitance is reduced by reducing the number of signal paths in the single-pole, multi-throw switch circuit, and impedance viewed from the common port and the single port can be concentrated to 50Ω by the first matching circuit 50 connected to the common port. Accordingly, this example provides a wider frequency band of low VSWR than when only the single-pole, seven-throw switch circuit is used, achieving VSWR of 1.3 or less in as wide a frequency band as 824 MHz to 2170 MHz.

[3] Third Embodiment

Figure 23:
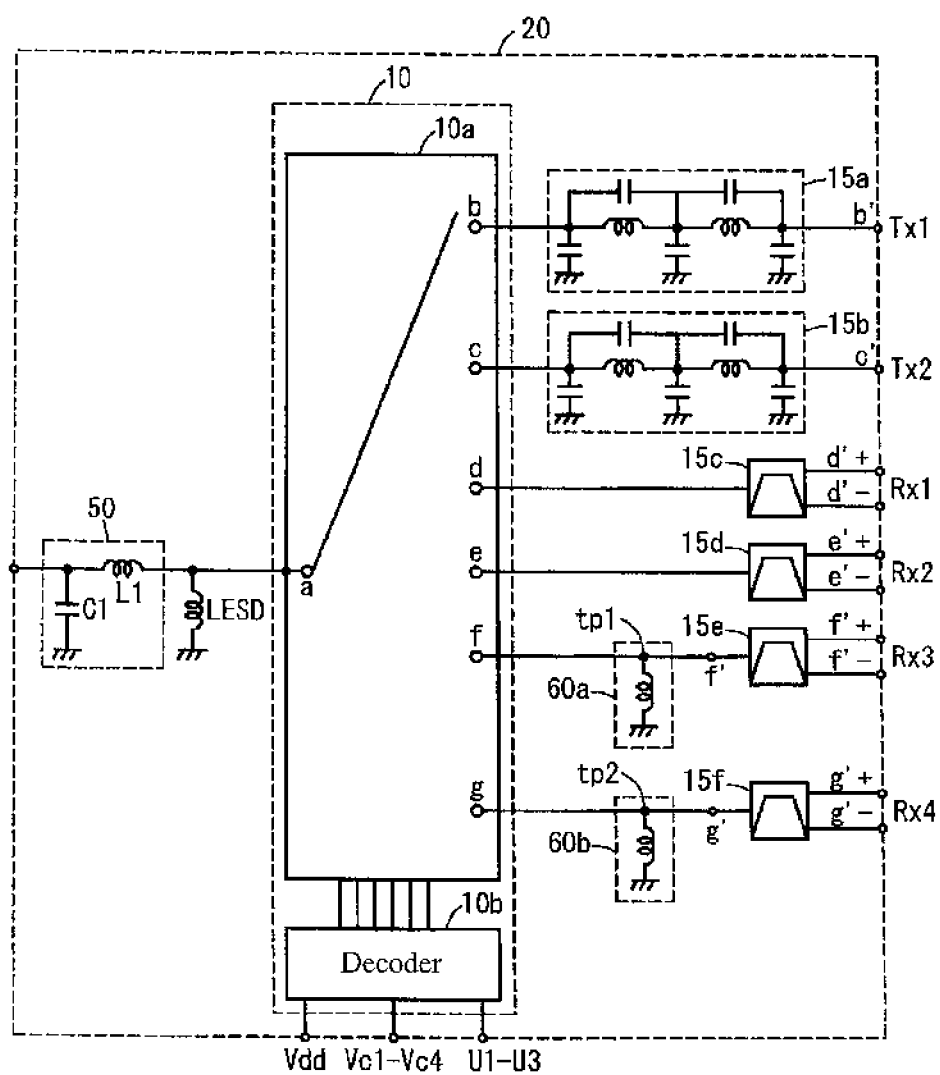
FIG. 23 is a view showing the equivalent circuit of a high-frequency circuit according to a still further of the present invention.
Figure 24:
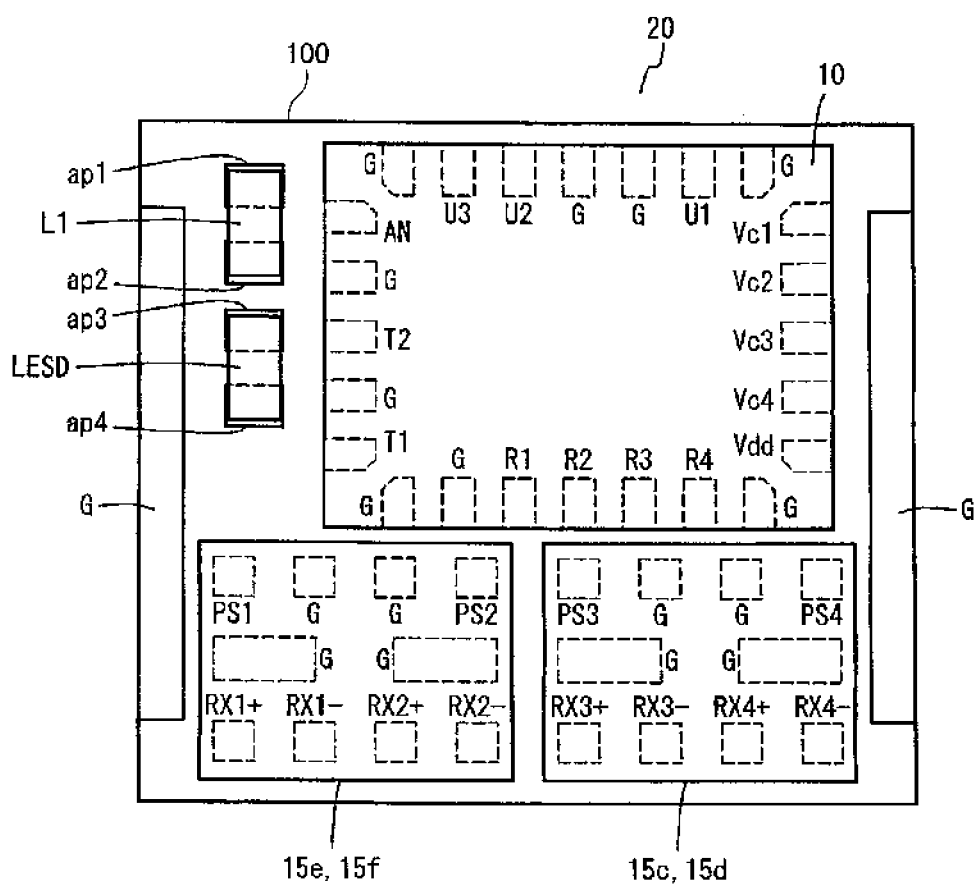
FIG. 24 is a plan view showing the appearance of one example of an insulating substrate (laminate substrate), in and on which the high-frequency circuit according to one embodiment of the present invention is formed.
Figure 25:
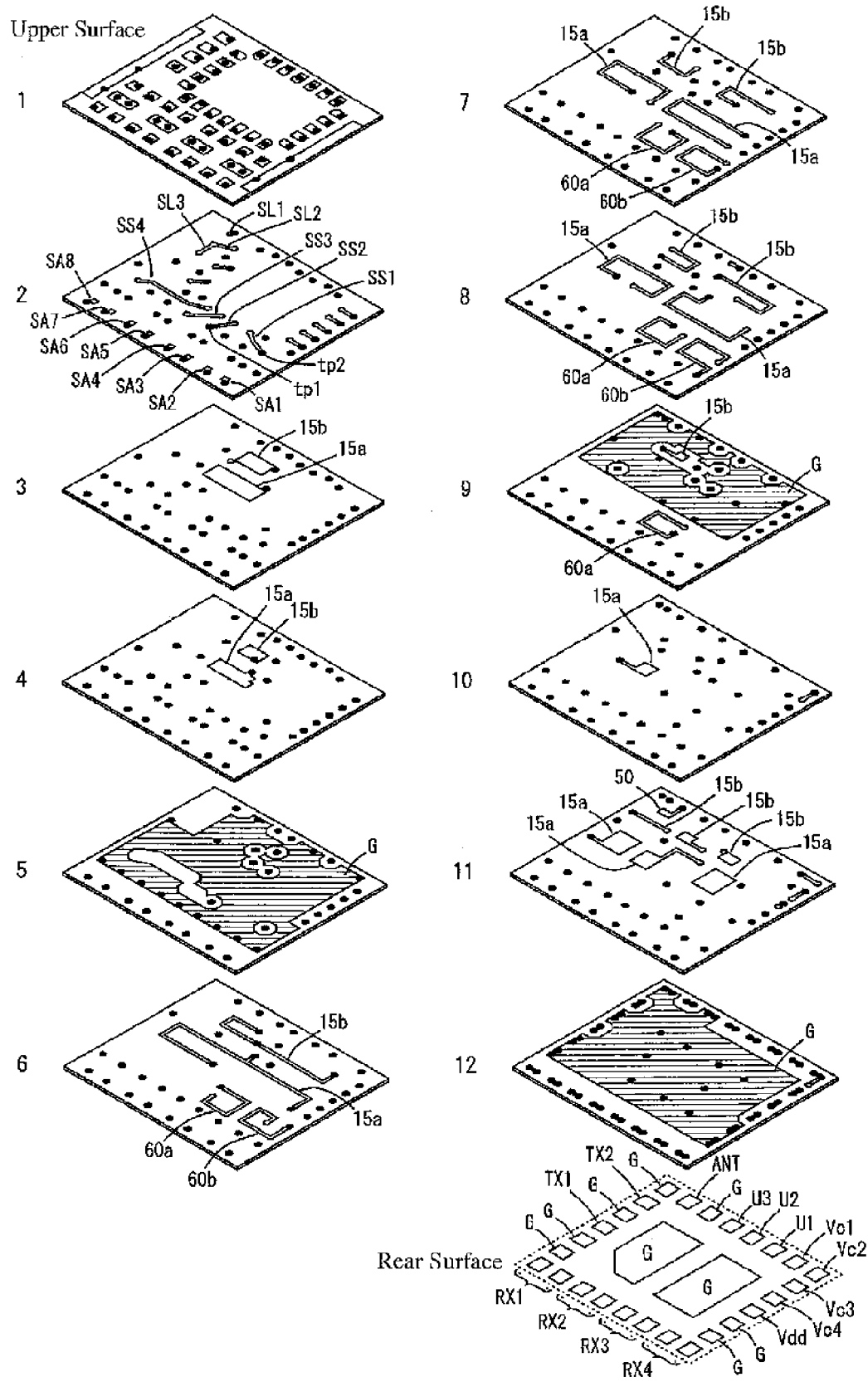
FIG. 25 is an exploded perspective view showing the internal structure of one example of an insulating substrate (laminate substrate), in which the high-frequency circuit according to one embodiment of the present invention is formed.
Figure 26:
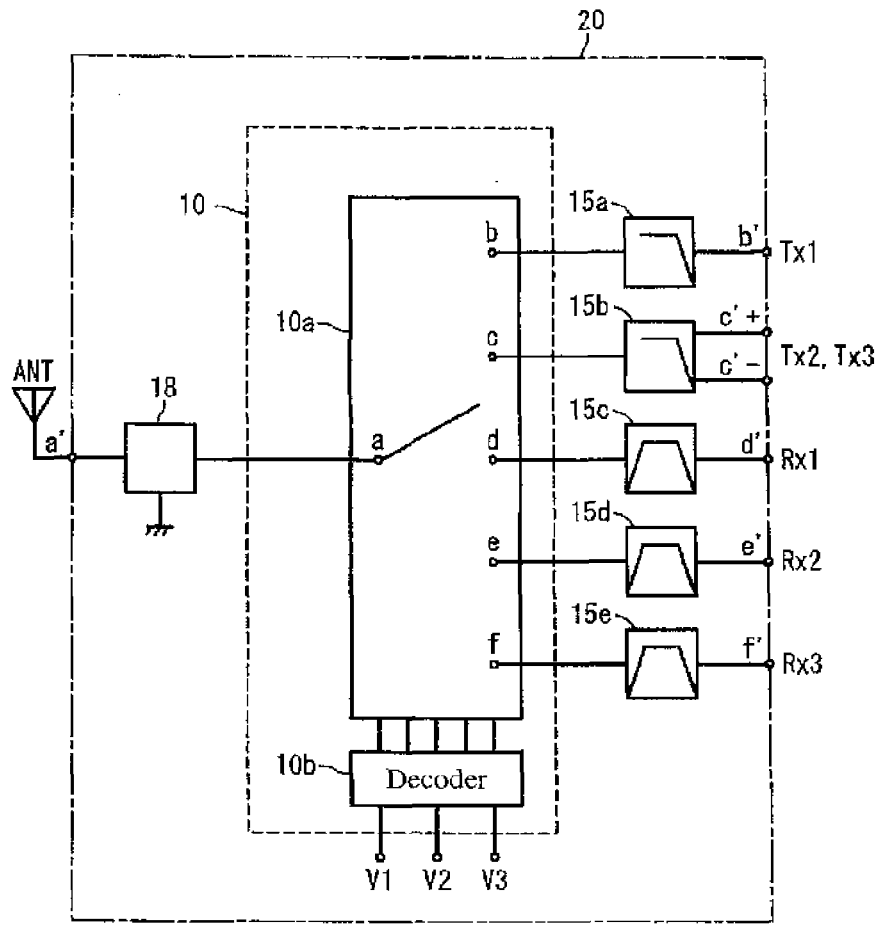
FIG. 26 is a block diagram showing the circuit of a conventional high-frequency switch module.
Figure 27:
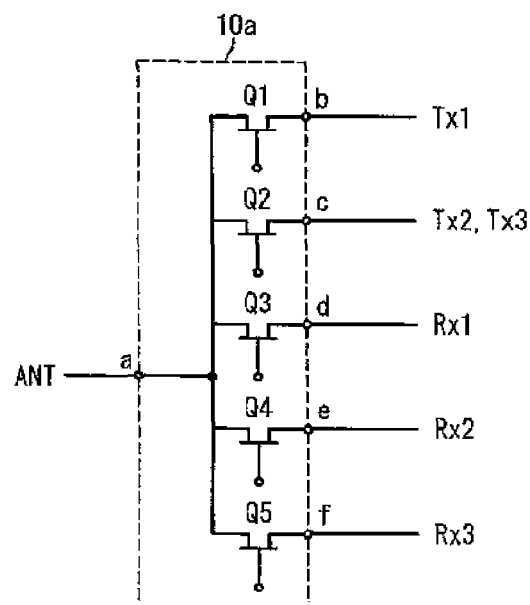
FIG. 27 is a view showing a single-pole, five-throw switch circuit used in conventional high-frequency switch modules.
Figure 28:
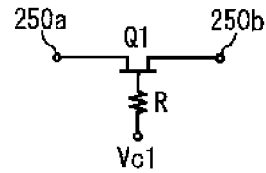
FIG. 28 is a view showing the structure of a single-pole, single-throw switch.
Figure 29:
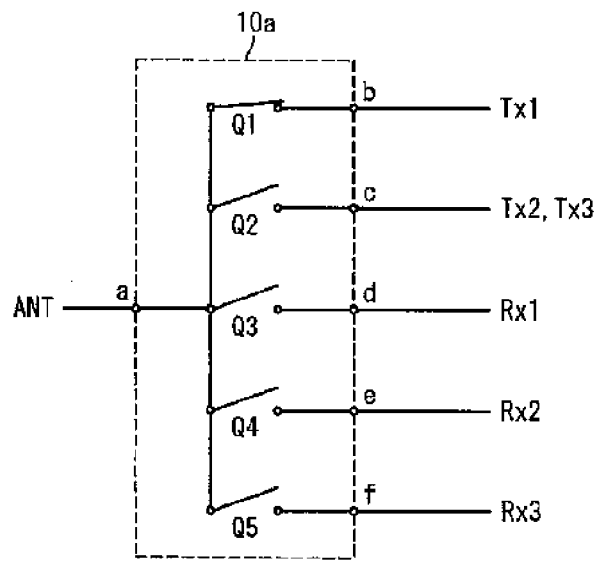
FIG. 29 is a view showing a conventional high-frequency switch module, in which a common port a are a first single port b are connected.
Figure 30:
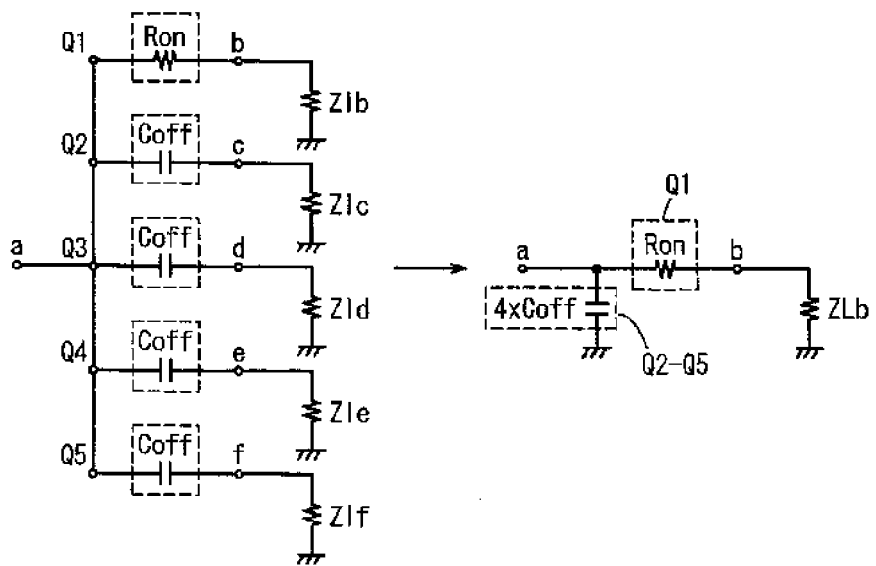
FIG. 30 is a view showing the equivalent circuit of a conventional high-frequency switch module when operated.
Figure 31:
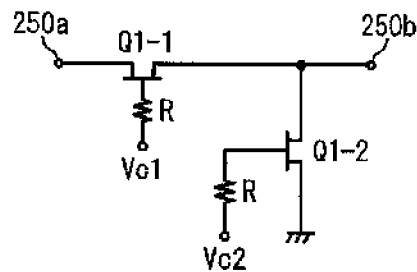
FIG. 31 is a view showing the structure of another single-pole, single-throw switch.
Figure 32:
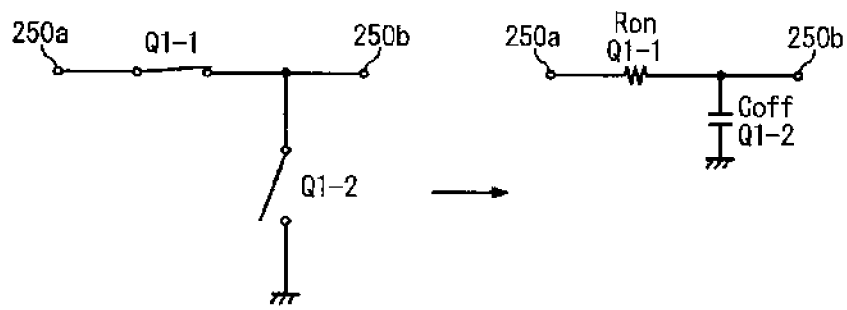
FIG. 32 is a view showing a single-pole, single-throw switch, in which an input terminal and an output terminal are connected.
Figure 33:
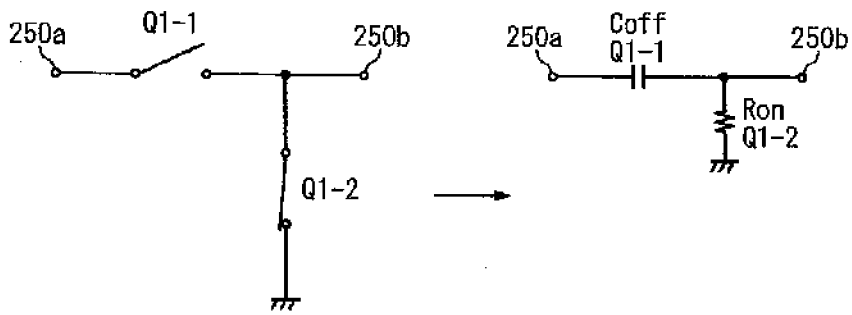
FIG. 33 is a view showing a single-pole, single-throw switch, in which an input terminal and an output terminal are not connected.

FIGS. 24 and 25 show an example in which the multiband high-frequency circuit having the equivalent circuit shown in FIG. 23 is formed in and on an insulating substrate (laminate substrate). FIG. 24 shows the appearance of an upper surface of a multiband high-frequency device having the switch device 10, the filter elements 15c-15f, and the first inductance element L1 of the first matching circuit 50 mounted on a laminate substrate 100, and the LC filter circuits 15a, 15b, the second matching circuits 60a, 60b, etc. formed in the laminate substrate 100, and FIG. 25 shows the internal structure of the laminate substrate 100. The laminate substrate 100 can be produced, for example, by laminating pluralities of ceramic green sheets having electrode patterns of 10-200 μm in thickness made of dielectric ceramics sinterable at as low temperatures as 1000° C. or lower, which are printed with a conductive paste of Ag, Cu, etc., and integrally sintering them.

The lowermost green sheet 12 is provided with a ground electrode G substantially covering the entire upper surface, and high-frequency terminals for being mounted on a circuit substrate on the rear surface. The high-frequency terminals comprise an antenna terminal ANT to be connected to an antenna-side circuit, transmission terminals Tx1, Tx2 to which transmitting signals are input, receiving terminals Rx1, Rx2, Rx3, Rx4 from which balanced signals are output, ground terminals G, and power supply terminals (control terminals) U1-U3, Vc1-Vc4, Vdd for controlling the switch circuit, and are connected to electrode patterns on upper green sheet layers through via-holes (shown by black circles) formed in the green sheets. Although the terminal electrodes are in LGA (land grid array) in this embodiment, BGA (ball grid array), etc. may be used. The receiving terminals Rx1, Rx2, Rx3, Rx4 are balanced terminal pairs aligned on one side of the laminate substrate 100.

The LC filter circuits 15a, 15b, the first capacitance element C1 of the first matching circuit 50, and the second inductance elements of the second matching circuits 60a, 60b are formed by electrode patterns on the green sheets 1-11 above the green sheet 12, and connected through via-holes. The green sheet 2 is provided with connecting lines SS1-SS4, SL2 connected to the switch device 10, the filter elements 15c-15d and the first inductance element L1 of the first matching circuit 50 mounted on the upper surface of the laminate substrate 100. The green sheet 1 is provided with pluralities of land electrodes for mounting devices.

The rectangular switch device 10 comprises a single-pole, six-throw switch circuit 10a and a decoder 10b on a silicon substrate, having a first side, along which pluralities of filter terminals (receiving terminals) R1-R4 connected to the filter elements 15c-15f are aligned, a second side clockwise adjacent to the first side, along which the antenna terminal ANT connected to the first matching circuit 50, and filter terminals (transmission terminals) T1, T2 connected to the LC filter circuits 15a, 15b are aligned, a third side clockwise adjacent to the second side, along which the control terminals U1-U3 are aligned, and a fourth side clockwise adjacent to the third side, along which the control terminals Vc1-Vc4, Vdd are aligned. The ground terminals G are arranged at positions suppressing interference between terminals, such as between the filter terminals R1-R4 and the LC filter terminals T1, T2, etc.

The filter elements 15c-15f disposed close to the switch device 10 on the laminate substrate 100 have unbalanced terminals PS1-PS4 connected to the filter terminals R1-R4 of the switch device 10, balanced terminals RX1+, RX1−, RX2+, RX2−, RX3+, RX3−, RX4+, RX4− from which balanced signals are output, and the ground terminals G, the filter terminals R1-R4 being connected to the unbalanced terminals PS1-PS4 by the connecting lines SS1-SS4. With the switch device 10 positioned close to the filter elements 15c-15d, the connecting lines SS1-SS4 may be short, suppressing parasitic reactance. The ends tp1, tp2 of the connecting lines SS1, SS2 are connected through via-holes to electrode patterns for the second inductance elements of the second matching circuit 50 on lower layers. The balanced terminals RX1+, RX1−, RX2+, RX2−, RX3+, RX3−, RX4+, RX4− of the filter elements 15c-15f are connected to the receiving terminals Rx1, Rx2, Rx3, Rx4 on the bottom surface of the laminate substrate 100 through extremely short connecting lines SA1-SA7 and via-holes. In this example, the filter elements 15c, 15d constitute a discrete part, and the filter elements 15e, 15f constitute a discrete part, but each filter element or four filter elements may constitute one part.

The first inductance element L1 of the first matching circuit 50 is mounted on land electrodes ap1, ap2 close to the switch device 10 on the laminate substrate 100. The land electrode apt is connected to the antenna terminal ANT on the bottom surface of the laminate substrate 100 through the connecting line SL1 and via-holes, and the land electrode ap2 is connected to the antenna terminal ANT of the switch device 10 through the connecting line SL2, and also connected to an the inductance element LESD mounted on land electrodes ap3, ap4 through the connecting line SL2. The first inductance element L1 is arranged near a second side different from the first side of the switch device 10 close to the filter elements 15c-15d on the laminate substrate 100, to avoid their connecting lines from being close to each other, thereby preventing the deterioration of isolation characteristics and signal loss characteristics. With the connecting lines avoiding overlap in a lamination direction, the deterioration of isolation characteristics and signal loss characteristics can be prevented.

Electrode patterns and connecting lines formed three-dimensionally in the laminate substrate 100 to constitute the high-frequency circuit are separated by the ground electrodes G to avoid unnecessary electromagnetic interference, or arranged to avoid overlap in a lamination direction. In this example, electrode patterns forming the LC filter circuits 15a, 15b, the second inductance elements of the second matching circuits 60a, 60b, and the first capacitance element of the first matching circuit 50 are arranged to avoid overlap in a lamination direction.

Dielectric ceramics include, for example, ceramics comprising Al, Si and Sr as main components, and Ti, Bi, Cu, Mn, Na, K, etc. as sub-components; ceramics comprising Al, Si and Sr as main components, and Ca, Pb, Na, K, etc. as sub-component, Al; ceramics comprising Mg, Si and Gd, Al; and ceramics comprising Si, Zr and Mg. The dielectric ceramics preferably have dielectric constants of about 5-15. Other than the dielectric ceramics, resins or resin/ceramic composites may be used. Further, electrode patterns may be formed on an $Al_2O_3$-based substrate with high-temperature-sinterable, conductive metals such as tungsten, molybdenum, etc., using an HTCC (high-temperature cofirable ceramics) technology.

The FET switch circuits constituting the switch device 10 are not particularly restricted, but may use GaAs-FET, CMOS-FET, etc. They may be used in a bare state and sealed with resins or tubes. Such high-frequency device is suitable for miniaturization. High-frequency amplifiers, low-noise amplifiers, etc. for the transmission/reception circuits may be formed in the laminate substrate 100.

Effect of the Invention

According to the present invention, even when the FET switches have different equivalent capacitances between signal paths in the high-frequency circuit comprising a single-pole, multi-throw switch circuit, impedance difference between the signal paths can be easily suppressed, preventing the deterioration of isolation characteristics and signal loss characteristics, thereby improving VSWR characteristics in higher frequency bands.

What is claimed is:

1. A high-frequency circuit for use in a multiband wireless apparatus for switching the connection between an antenna and transmission/reception circuits depending on signals for pluralities of communications systems used in a basic frequency band and higher frequency bands than the basic frequency band, comprising
    a single-pole, multi-throw switch circuit comprising FET switch circuits between a common port connected to an antenna-side circuit and pluralities of single ports connected to the transmission/reception circuits, the connection between the antenna and the transmission/reception circuits being switched by controlling the ON/OFF state of each FET switch circuit, and
    a first matching circuit connected to said common port;
    wherein the impedance of the single-pole, multi-throw switch circuit is capacitive when viewing from said common port,
    wherein said first matching circuit comprises a first inductance element connected in series to a signal path between said antenna and said common port, and a first capacitance element connected to said first inductance element on the antenna side and grounded,
    wherein said first inductance element makes the impedance of said single-pole, multi-throw switch circuit inductive when said single port is viewed from said antenna side when at least a FET switch circuit, through which a higher frequency band passes, is controlled in an ON state, and
    wherein the capacitance of said first capacitance element is set depending on a synthesized equivalent capacitance of the FET switch circuits in an OFF state, whereby said first capacitance element adjusts impedance matching between said antenna-side circuit and said transmission/reception circuits.

2. The high-frequency circuit according to claim 1, further comprising:
    a filter circuit disposed between at least one of said single ports and each corresponding transmission/reception circuit, and at least one second matching circuit disposed between said single port and said filter circuit, at least one of said filter circuits being a bandpass filter, said second matching circuit comprising a second inductance element connected in series to a signal path or between said signal path and the ground.

3. The high-frequency circuit according to claim 1, further comprising:
    an LC filter circuit disposed between at least one of said single ports and each corresponding transmission/reception circuit, said LC filter circuit comprising a third inductance element and a second capacitance element.

4. The high-frequency circuit according to claim 1, wherein pluralities of said communications systems have multi-connection systems including a TDMA (time division multiple access) system and a CDMA (code division multiple access) system.

5. A multiband wireless communications apparatus comprising the high-frequency circuit recited in claim 1.

6. The high-frequency circuit according to claim 1, wherein the first inductance element is connected to the antenna-side circuit via a first node and the first capacitance element is connected to the first inductance element on the antenna side via the first node.

7. The high-frequency circuit according to claim 1, wherein one end of the first inductance element and one end of the first capacitance element are directly connected to the antenna-side circuit.

8. The high-frequency circuit according to claim 1, wherein the synthesized equivalent capacitance is set in a mode of connecting a signal path of a communications system in the highest frequency by synthesizing equivalent capacitances of the FET switch circuits except for the FET switch circuit for the communications system in the highest frequency band in an OFF state.

9. The high-frequency circuit according to claim 1, wherein the synthesized equivalent capacitance is set to the signal path having the largest synthesized capacitance among those of communications systems in higher frequency bands when the synthesized equivalent capacitance of the FET switches in an OFF state differs depending on the signal path.

10. A high-frequency circuit for use in a multiband wireless apparatus for switching the connection between an antenna and transmission/reception circuits depending on signals for pluralities of communications systems, comprising;
    a single-pole, multi-throw switch circuit comprising FET switch circuits between a common port connected to an antenna-side circuit and pluralities of single ports connected to the transmission/reception circuits, and a first matching circuit connected to said common port;
    said first matching circuit comprising a first inductance element connected in series to a signal path between said antenna and said common port, and a first capacitance element connected to said first inductance element on the antenna side and grounded, said first inductance element making the impedance of said single-pole, multi-throw switch circuit inductive when single port is viewed from said antenna side, and said first capacitance element adjusting impedance matching between said antenna-side circuit and said transmission/reception circuits, wherein pluralities of said communications systems have multi-connection systems including Time Division Multiple Access (TDMA) system and a CDMA Code Division Multiple Access (CDMA) system;
    a bandpass filter connected between a first single port and a first reception circuit for the first communications system of a TDMA system;
    an LC filter circuit connected between a second single port and a first transmission circuit for the first and second communications systems of the TDMA system;
    first duplexers connected between a third single port and a second reception circuit for the second communications system of the TDMA system and the first communications system of the CDMA system, and a second transmission circuit for the first communications system of the CDMA system; and
    second duplexers connected between a fourth single port and a third reception circuit for the second communications system of the CDMA system and a third transmission circuit for the second communications system of the CDMA system;
    said second matching circuit being connected to at least one path between said first single port of said single-pole, multi-throw switch circuit and said bandpass filter, between said third single port and said first duplexer, and between said the fourth single port and said second duplexer.

11. The high-frequency circuit according to claim 10, wherein a third matching circuit comprising a fourth inductance element is disposed between said first duplexer and said second transmission circuit.

12. A high-frequency device having in and on an insulating substrate a high-frequency circuit for use in a multiband wireless apparatus for switching the connection between an antenna and transmission/reception circuits depending on signals for pluralities of communications systems,
    said high-frequency circuit comprising a single-pole, multi-throw switch circuit having FET switch circuits between a common port connected to the antenna and pluralities of single ports connected to the transmission/reception circuits, and a first matching circuit connected to said common port, and filter circuits disposed between said single ports and the transmission/reception circuits, at least one of said filter circuits being a bandpass filter;
    said first matching circuit comprising a first inductance element connected in series to a signal path between the antenna and the common port of the single-pole, multi-throw switch circuit, and a first capacitance element connected to said first inductance element on the antenna side and grounded;
    pluralities of filter terminals connected to said filter circuits being aligned on a first side of a bottom surface of a switch device having said single-pole, multi-throw switch circuit;
    filter elements constituting said filter circuits being mounted on an upper surface of said insulating substrate adjacently to said first side of said switch device; and
    said switch device and said filter elements being connected via connecting lines formed in said insulating substrate.

13. The high-frequency device according to claim 12, wherein said switch device has an antenna terminal on a second side adjacent to said first side; wherein the first inductance element of said first matching circuit is mounted on said laminate substrate at a position adjacent to the second side of said switch device; and wherein said switch device is connected to said first inductance element via connecting lines formed in said insulating substrate.

14. The high-frequency device according to claim 12, further comprising:
    a second matching circuit comprising a second inductance element connected to a signal path between said single port and said filter circuit, said second inductance element being formed by electrode patterns beneath said filter elements in the insulating substrate.

15. The high-frequency device according to claim 14, wherein electrode patterns of the second inductance elements connected to different signal paths do not overlap each other in a lamination direction.

16. The high-frequency device according to claim 12, further comprising:
    an LC filter circuit disposed in a path between at least one of said single ports and each corresponding transmission/reception circuit, said LC filter circuit comprising a third inductance element and a second capacitance element, said third inductance element and said second capacitance element being formed by electrode patterns beneath said switch device in said insulating substrate.

17. The high-frequency device according to claim 16, wherein electrode patterns for the LC filter circuits connected to different signal paths do not overlap each other in a lamination direction.

18. The high-frequency device according to claim 12, wherein pluralities of terminals including high-frequency terminals for connecting the antenna and the transmission/reception circuits are formed on a bottom surface of said insulating substrate; and wherein pluralities of high-frequency terminals connected to the reception circuits are aligned on one side of said insulating substrate.

19. A multiband wireless communications apparatus comprising the high-frequency device recited in claim 12.

20. A high-frequency device having in and on an insulating substrate a high-frequency circuit for use in a multiband wireless apparatus for switching the connection between an antenna and transmission/reception circuits depending on signals for pluralities of communications systems,
said high-frequency circuit comprising a single-pole, multi-throw switch circuit having FET switch circuits between a common port connected to the antenna and pluralities of single ports connected to the transmission/reception circuits, a first matching circuit connected to said common port, and filter circuits disposed between said single ports and said transmission/reception circuits, at least one of said filter circuits being a bandpass filter,
said first matching circuit comprising a first inductance element connected in series to a signal path between said antenna and said common port, and a first capacitance element connected to said first inductance element on the antenna side and grounded;
pluralities of filter terminals connected to said filter circuits being aligned on a bottom surface of a switch device having said single-pole, multi-throw switch circuit, and an antenna terminal connected to said antenna being formed on said bottom surface;
said switch device, filter elements constituting said filter circuits and the first inductance element constituting said first matching circuit being adjacently mounted on an upper surface of said insulating substrate; and
said switch device and said filter element, and said switch device and said first inductance element being respectively connected via connecting lines formed in said insulating substrate such that the connecting lines do not overlap each other in a lamination direction.

21. The high-frequency device according to claim 20, wherein said insulating substrate is provided on the bottom surface with pluralities of terminals including high-frequency terminals for connecting the antenna and the transmission/reception circuits; wherein said insulating substrate having pluralities of high-frequency terminals aligned on one side and connected to the reception circuits, and an antenna terminal formed on the other side adjacently to the ground terminal and connected to the antenna; wherein the connection of said antenna terminal to said first matching circuit and the connection of said receiving terminal to said filter terminal are respectively made by connecting lines in said insulating substrate; and wherein connecting lines between said antenna terminal and said switch device, and connecting lines between said receiving terminals and said filter elements do not overlap each other in a lamination direction.

22. The high-frequency device according to claim 20, further comprising:
a second matching circuit comprising a second inductance element connected to a signal path between said single port and said filter circuit, said second inductance element being formed by electrode patterns beneath said filter elements in the insulating substrate.

23. The high-frequency device according to claim 20, comprising an LC filter circuit disposed in a path between at least one of said single ports and each corresponding transmission/reception circuit, said LC filter circuit comprising a third inductance element and a second capacitance element, said third inductance element and said second capacitance element being formed by electrode patterns beneath said switch device in said insulating substrate.

24. The high-frequency device according to claim 20, wherein pluralities of terminals including high-frequency terminals for connecting the antenna and the transmission/reception circuits are formed on a bottom surface of said insulating substrate; and wherein pluralities of high-frequency terminals connected to the reception circuits are aligned on one side of said insulating substrate.

25. A high-frequency device having in and on an insulating substrate a high-frequency circuit for use in a multiband wireless apparatus for switching the connection between an antenna and transmission/reception circuits depending on signals for pluralities of communications systems,
said high-frequency circuit comprising a single-pole, multi-throw switch circuit having FET switch circuits between a common port connected to the antenna and pluralities of single ports connected to the transmission/reception circuits, a first matching circuit connected to said common port, and filter circuits disposed between said single ports and the transmission/reception circuits, at least one of said filter circuits being a bandpass filter;
said first matching circuit comprising a first inductance element connected in series to a signal path between the antenna and the common port of said single-pole, multi-throw switch circuit, and a first capacitance element connected to said first inductance element on the antenna side and grounded;
pluralities of filter terminals connected to said filter circuits being aligned on a bottom surface of a switch device having said single-pole, multi-throw switch circuit, and an antenna terminal connected to said antenna being formed on said bottom surface;
said switch device, filter elements constituting said filter circuits and the first inductance element constituting said first matching circuit being adjacently mounted on an upper surface of said insulating substrate;
said switch device and said filter element, and said switch device and said first inductance element being respectively connected via connecting lines formed in the multi-layer insulating substrate; and
layers having ground electrodes being disposed between said connecting lines formed on different layers.

26. The high-frequency device according to claim 25, comprising a second matching circuit comprising a second inductance element connected to a signal path between said single port and said filter circuit, said second inductance element being formed by electrode patterns beneath said filter elements in the insulating substrate.

27. The high-frequency device according to claim 25, comprising an LC filter circuit disposed in a path between at least one of said single ports and each corresponding transmission/reception circuit, said LC filter circuit comprising a third inductance element and a second capacitance element, said third inductance element and said second capacitance element being formed by electrode patterns beneath said switch device in said insulating substrate.

28. The high-frequency device according to claim 25, wherein pluralities of terminals including high-frequency terminals for connecting the antenna and the transmission/reception circuits are formed on a bottom surface of said insulating substrate; and wherein pluralities of high-frequency terminals connected to the reception circuits are aligned on one side of said insulating substrate.

29. The high-frequency device according to claim 25, wherein said insulating substrate is provided on the bottom surface with pluralities of terminals including high-frequency terminals for connecting the antenna and the transmission/reception circuits; wherein said insulating substrate having pluralities of high-frequency terminals aligned on one side and connected to the reception circuits, and an antenna terminal formed on the other side adjacently to the ground terminal and connected to the antenna; wherein the connection of said antenna terminal to said first matching circuit and the connection of said receiving terminal to said filter terminal are respectively made by connecting lines in said insulating substrate; and wherein connecting lines between said antenna terminal and said switch device, and connecting lines between said receiving terminals and said filter elements do not overlap each other in a lamination direction.

* * * * *